United States Patent
Sasaoka et al.

(10) Patent No.: US 6,949,144 B2
(45) Date of Patent: Sep. 27, 2005

(54) LOW PRESSURE PLASMA PROCESSING APPARATUS AND METHOD

(75) Inventors: Tatsuo Sasaoka, Osaka (JP); Naoki Suzuki, Neyagawa (JP); Ken Kobayashi, Hirakata (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/270,680

(22) Filed: Oct. 16, 2002

(65) Prior Publication Data

US 2004/0084148 A1 May 6, 2004

(30) Foreign Application Priority Data

Oct. 18, 2001 (JP) ........................................ 2001-320472

(51) Int. Cl.⁷ ...................... C23C 16/00; H01L 21/306
(52) U.S. Cl. .............. 118/719; 118/723 R; 156/345.32; 414/217; 414/222.01
(58) Field of Search ............................. 118/719, 723 R; 156/345.31, 345.32; 414/217, 222.01, 935, 937, 939, 941

(56) References Cited

U.S. PATENT DOCUMENTS

| | | | | |
|---|---|---|---|---|
| 5,788,868 A | * | 8/1998 | Itaba et al. | 216/41 |
| 5,882,413 A | * | 3/1999 | Beaulieu et al. | 118/719 |
| 6,350,321 B1 | * | 2/2002 | Chan et al. | 118/719 |
| 6,467,491 B1 | * | 10/2002 | Sugiura et al. | 134/1.3 |

* cited by examiner

Primary Examiner—Michael Barr
Assistant Examiner—Saeed Chaudhry
(74) Attorney, Agent, or Firm—Wenderoth, Lind & Ponack, L.L.P.

(57) ABSTRACT

There are provided a low pressure plasma processing apparatus and method by which a throughput can be improved, film contamination can be effectively prevented, and a film can be readily managed. A film substrate is carried in from the outside of a plasma processing apparatus main body to a substrate carrying position in the plasma processing apparatus main body, the film substrate positioned at the substrate carrying position is carried into a chamber, a reaction gas is introduced while the chamber is being evacuated, high frequency power is applied under low pressure to generate plasma so that plasma processing is performed to remove organic matter from the film substrate, and the film substrate subjected to plasma processing is taken out from the chamber and positioned at a substrate carrying-out position in the plasma processing apparatus main body and carried out of the plasma processing apparatus main body.

6 Claims, 27 Drawing Sheets

WHEN FILM IS FED

NOZZLE POSITION

ELECTROSTATIC CHUCK VOLTAGE

← CHUCK OFF TIME →

NOZZLE SUCTION

NOZZLE BLOW

← BLOW TIME →

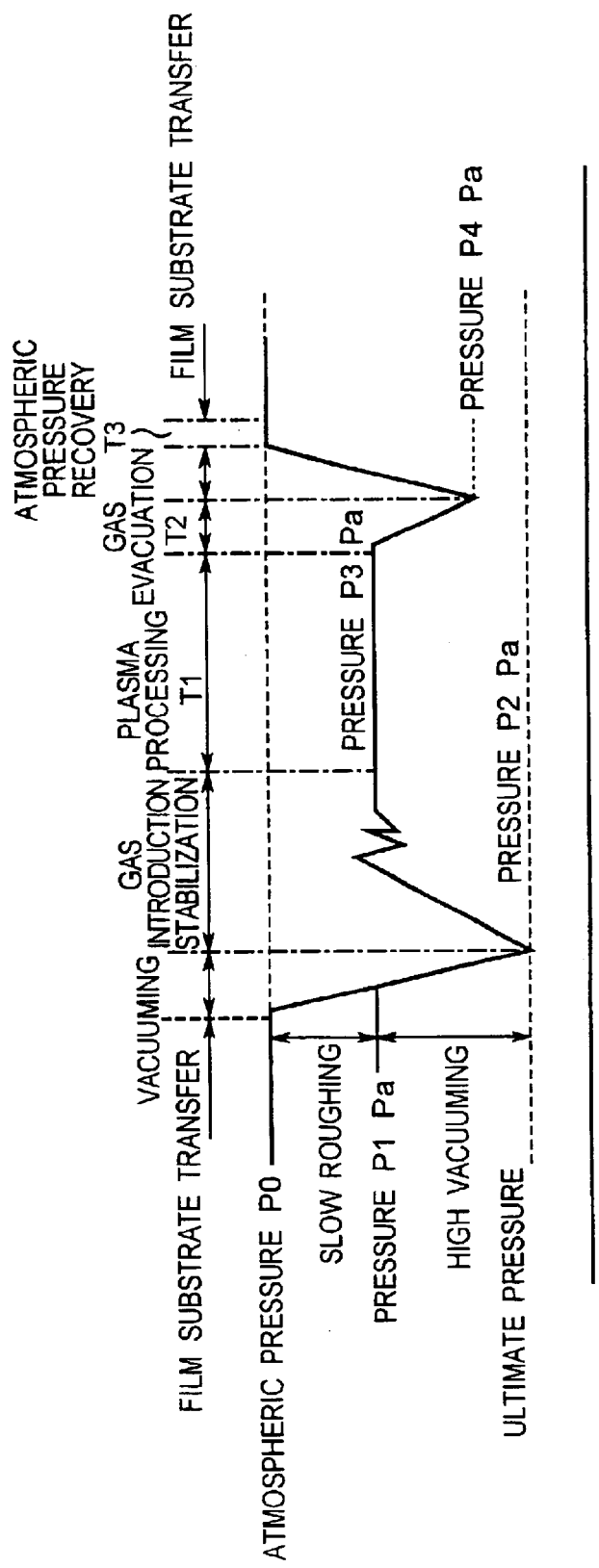

LOW PRESSURE PLASMA PROCESSING APPARATUS AND METHOD

BACKGROUND OF THE INVENTION

The present invention relates to a plasma processing apparatus in which plasma is generated to process a surface of a substrate to be processed under low pressure (reduced pressure) atmosphere.

In a field of mounting techniques, high-density mounting is required as electronic equipment is made smaller and has higher functions. Therefore, connection of a device or element to a mounting substrate is made fine, and hence mounting with higher reliability is required. One method for ensuring reliability is a method of modification of a property of a surface with plasma. For example, since organic contaminants attached to the surface are removed by this plasma processing, bonding strength of wire bonding, wettability, and adhesion between the substrate and a sealing resin can be improved. That is, surface activation action, in which the substrate surface is activated by oxygen plasma, a carboxyl group (COO), carbonyl group (C=O), or the like is generated, is caused and leads to improvement of bonding strength. Furthermore, surface washing (cleaning) action occurs due to sputtering action by argon ions or oxygen ions.

In particular, when ions such as chlorine remain on the substrate surface in a flexible circuit board constituted by a film or the like, a circuit may corrode due to moisture surrounding the substrate and a voltage applied between wiring lines on the substrate. Therefore, chlorine or the like attached to the surface is removed by plasma.

As a conventional constitution of such plasma processing, several films are manually placed in a chamber, and a series of operations including closing of a chamber lid, vacuum roughing, high vacuuming, gas valve opening, high frequency power application, stopping of high frequency power application, atmospheric pressure recovery, and opening of the chamber are manually performed one by one. Vacuum pressure is confirmed by using a vacuum gauge, and time of high frequency power application is measured by using a stop watch.

However, since batch processing is inevitably performed in the apparatus having the above constitution, its throughput is limited. Furthermore, since a film is manually placed and removed, the film may be contaminated. Furthermore, since a blank occurs between washing and a subsequent step, management of the film is difficult.

Accordingly, an object of the present invention is to provide a low pressure plasma processing apparatus and method with which a throughput can be improved, film contamination can be effectively prevented, and a film can be easily managed, thus solving the above issues.

SUMMARY OF THE INVENTION

In order to achieve the above object, the present invention is constituted as follows.

According to a first aspect of the present invention, there is provided a low pressure plasma processing apparatus comprising:

a carrying arm device for holding a film substrate;

a moving device for moving the carrying arm device between a substrate carrying-in preparation position outside a plasma processing apparatus main body and a substrate carrying-in position in the plasma processing apparatus main body, and moving the carrying arm device between a substrate carrying-out preparation position in the plasma processing apparatus main body and a substrate carrying-out position outside the plasma processing apparatus main body; and a chamber in which, after the carrying arm device is moved from the substrate carrying-in preparation position to the substrate carrying-in position by drive of the moving device, the film substrate held by the carrying arm device is carried in, a reaction gas is introduced while the chamber is being evacuated, high frequency power is applied under low pressure to generate plasma so that plasma processing is performed to remove organic matter from the film substrate, and the film substrate subjected to the plasma processing is held by the carrying arm device and carried out from the substrate carrying-out preparation position to the substrate carrying-out position.

According to a second aspect of the present invention, there is provided the low pressure plasma processing apparatus according to the first aspect, further comprising: a substrate carrying-in slider for holding and carrying in the film substrate from the outside of the plasma processing apparatus main body, in which the chamber is disposed, into the plasma processing apparatus main body; and a substrate carrying-out slider for holding and carrying out the film substrate subjected to the plasma processing from an inside of the plasma processing apparatus main body to the outside of the plasma processing apparatus main body.

According to a third aspect of the present invention, there is provided the low pressure plasma processing apparatus according to the first or second aspect, wherein the chamber comprises a first chamber and a second chamber, each for subjecting a plurality of the film substrates to plasma processing, and, independently performing plasma processing including, after the film substrates are carried into the first chamber and the second chamber, introducing a reaction gas while the chambers are being evacuated, and applying high frequency power under low pressure to generate plasma so that organic matter is removed from the film substrate.

According to a fourth aspect of the present invention, there is provided the low pressure plasma processing apparatus according to any one of the first to fourth aspects, further comprising a communicating tube for communicating the first chamber and the second chamber and an opening/closing valve for opening/closing the communicating tube, wherein, after the film substrate is carried in and taken out from one chamber of the first chamber and the second chamber, pressure is decreased from an atmospheric pressure state to a low pressure state and at the same time, taking-out of the film substrate is prepared by recovering the other chamber from a low pressure state to an atmospheric pressure state, and at the preparing time, the opening/closing valve is opened to communicate the first chamber and the second chamber by the communicating tube so that both the chambers have a same pressure.

According to a fifth aspect of the present invention, there is provided the low pressure plasma processing apparatus according to any one of the first to fourth aspects, wherein the film substrate is chucked and held to the electrode on which high frequency power is applied by electrostatic chuck in the chamber.

According to a sixth aspect of the present invention, there is provided a low pressure plasma cleaning method comprising:

carrying in a film substrate from the outside of a plasma processing apparatus main body to a substrate carrying position in a plasma processing apparatus main body;

carrying the film substrate positioned at the substrate carrying position into a chamber;

introducing a reaction gas while the chamber is being evacuated and applying high frequency power under low pressure to generate plasma so that plasma processing is performed to remove organic matter from the film substrate;

taking out the film substrate subjected to plasma processing from the chamber and positioning the film substrate at a substrate carrying-out position in the plasma processing apparatus main body; and carrying out the film substrate positioned at the substrate carrying-out position to the outside of the plasma processing apparatus main body.

According to a seventh aspect of the present invention, there is provided a low pressure plasma cleaning method comprising:

carrying in a first film substrate from an outside of a plasma processing apparatus main body to a substrate carrying position in the plasma processing apparatus main body;

carrying the first film substrate positioned at the substrate carrying position into a first chamber;

introducing a reaction gas while the first chamber is being evacuated and applying high frequency power under low pressure generate plasma so that plasma processing is performed to remove organic matter from the first film substrate;

taking out the first film substrate subjected to plasma processing from the first chamber and positioning the film substrate at a substrate carrying-out position in the plasma processing apparatus main body; and carrying out the first film substrate positioned at the substrate carrying-out position to the outside of the plasma processing apparatus main body;

during the plasma processing operation of a first film substrate in the first chamber, carrying in a second film substrate from the outside of the plasma processing apparatus main body to the substrate carrying position in the plasma processing apparatus main body, and carrying the second film substrate positioned at the substrate carrying position into a second chamber;

when the first film substrate is taken out from an inside of the first chamber and carried out of the plasma processing apparatus main body, introducing a reaction gas while the second chamber is being evacuated, applying high frequency power under low pressure to generate plasma so that plasma processing is performed to remove organic matter from the second film substrate; and thereafter, taking out the second film substrate subjected to the plasma processing from the second chamber and positioned at the substrate carrying-out position in the plasma processing apparatus main body, and carrying the second film substrate positioned at the substrate carrying-out position to the outside of the plasma processing apparatus main body.

According to an eighth aspect of the present invention, there is provided the low pressure plasma cleaning method according to the seventh aspect, wherein, while the film substrate is being carried into or taken out from one chamber of the first chamber and the second chamber, and the other chamber is recovered from a low pressure state to an atmospheric pressure state to prepare taking-out of the film substrate, an opening/closing valve of a communicating tube for communicating the first chamber and the second chamber is opened to communicate the first chamber and the second chamber by the communicating tube to obtain a same pressure.

According to a ninth aspect of the present invention, there is provided the low pressure plasma processing method according to any one of the sixth to eighth aspects, wherein the film substrate is chucked and held on an electrode on which high frequency power is applied, by electrostatic chuck in the chamber.

BRIEF DESCRIPTION OF THE DRAWINGS

These and other aspects and features of the present invention will become clear from the following description taken in conjunction with the preferred embodiments thereof with reference to the accompanying drawings, in which:

FIG. 29 is a process flow of plasma processing of the above embodiment of the present invention;

DETAILED DESCRIPTION OF THE PREFERRED EMBODIMENTS

Figure 1A:
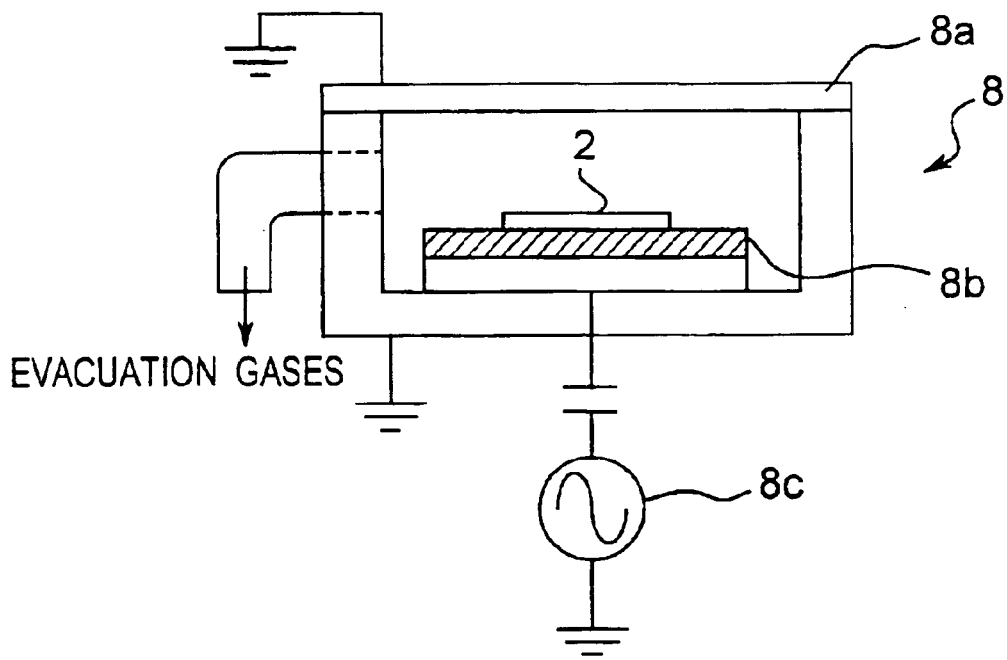
FIGS. 1A and 1B are a schematic explanatory view showing a low pressure plasma processing apparatus according to one embodiment of the present invention and an explanatory view for explaining a principle of the low pressure plasma processing by the low pressure plasma processing apparatus, respectively.

Before the description of the present invention proceeds, it is to be noted that like parts are designated by like reference numerals throughout the accompanying drawings.

Embodiments of the present invention are described in detail with reference to the accompanying drawings.

Figure 1B:
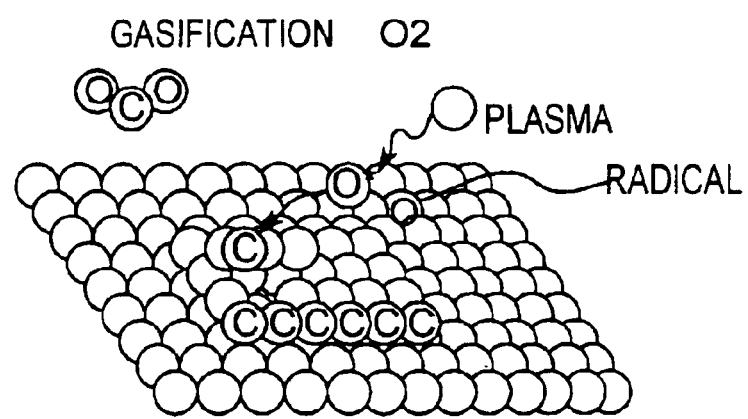

As shown in FIGS. 1A and 1B, in a plasma processing apparatus according to a first embodiment of the present invention, a circuit board such as a film substrate 2 is automatically carried in onto a substrate electrode 8b in a chamber 8, which is grounded, the chamber 8 is evacuated of gases by an evacuation device Rp, a predetermined reaction gas is introduced from a reaction gas supply device 998 into the chamber 8, and then, while a predetermined low pressure state is maintained, high frequency power is applied from a high frequency power source 8c to the substrate electrode 8b to generate oxygen plasma in the chamber 8. A surface of the substrate 2 held on the substrate electrode 8b is subjected to plasma processing by the generated oxygen plasma, and carbon atoms of organic matter on the substrate 2 surface and oxygen are bound so that the organic matter is automatically removed from the substrate 2 surface as a vapor phase of carbon dioxide. Thus, surfaces of connection portions of substrate electrodes or the like for bonding an IC chip, a component, or the like are activated to enhance bonding ability.

Specifically, as shown in FIGS. 2, 11 to 13, and 31, the plasma processing apparatus includes a substrate carrying-in slider 1 for holding a pair of film substrates 2, 2 and carrying in the pair of film substrates 2, 2 from the outside of a plasma processing apparatus main body 10 into the plasma processing apparatus main body 10, a pair of carrying arm devices 3A, 3B for sucking, holding and moving the pair of film substrates 2, 2 from the substrate carrying-in slider 1, a moving device 4, by which the pair of carrying arm devices 3A, 3B are fixed and supported, for moving the pair of carrying arm devices 3A, 3B along a substrate carrying direction (in a left direction in FIG. 2, see FIG. 15) F, a plasma processing chamber 8 having a first chamber 8A, in which the pair of film substrates 2, 2 are subjected to plasma processing, and a second chamber 8B, in which the pair of film substrates 2, 2 are subjected to plasma processing, a substrate carrying-out slider 9 for holding the pair of film substrates 2, 2 and carrying out the pair of film substrates 2, 2 from the inside of the plasma processing apparatus main body 10 to the outside of the plasma processing apparatus main body 10, and a controller 20 for controlling operations of devices, members, valves, and so forth.

While sucking and holding the pair of film substrates 2, 2, the substrate carrying-in slider 1 is moved between a substrate carrying-in preparation position A outside the plasma processing apparatus main body 10 and a substrate carrying-in position B inside the plasma processing apparatus main body 10 by the drive of a drive device such as a motor or an air cylinder under the operation control of the controller 20.

The moving device 4 has a pair of carrying arm devices 3A, 3B fixed and supported on a moving member 4a, and the moving member 4a can move reciprocate along a guide member 4b in the substrate carrying direction F by a drive device such as a servomotor 4c under the operation control of the controller 20.

Each of the pair of carrying arm devices 3A, 3B includes an arm drive device 6a such as a motor fixed on the moving member 4a, an arm 6, which is moved in an axial direction (direction perpendicular to the substrate carrying direction F) by the drive of the drive device 6a such as the motor, and a pair of suction units 7, 7, which are disposed at an end of the arm 6 and can be vertically moved by a suction unit elevator 7a. The pair of suction units 7, 7 are lowered to a lower end position by the drive of the suction unit elevator 7a under the operation control of the controller 20, and a pair of film substrates 2, 2 can be simultaneously sucked and held by the pair of suction units 7, 7 by the drive of a suction device 999. Furthermore, the pair of suction units 7, 7 can be moved between the substrate carrying-in slider 1 on a side closer to the moving member 4a or the substrate carrying-out slider 9 and each chamber 8 by the drive of the arm drive device 6a so that the pair of film substrates 2, 2 can be simultaneously delivered.

Figure 2:
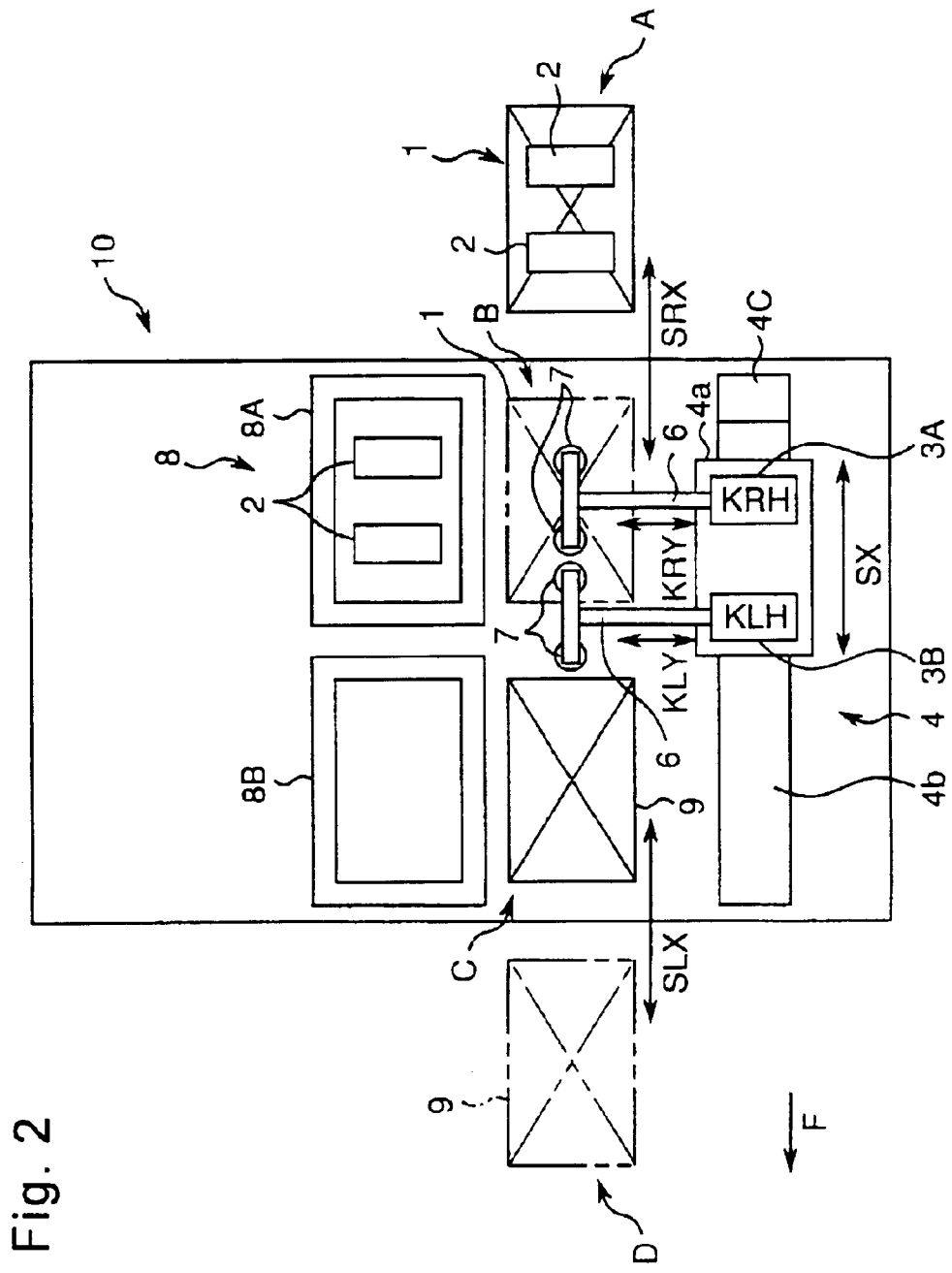
FIG. 2 is a schematic diagram showing the plasma processing apparatus.

One carrying arm device 3A (on the right side, that is, a side closer to the substrate carrying-in side in FIG. 2) is a carrying arm device for carrying the film substrates 2, 2 into the chambers 8A, 8B. The other carrying arm device 3B (on the left side, that is, a side closer to the substrate carrying-out side in FIG. 2) is a carrying arm device for carrying the film substrates 2, 2 out of the chambers 8A, 8B. Therefore, these carrying arm devices suck film substrates 2, 2 before plasma processing or film substrates 2, 2 after plasma processing, respectively, at all times. Since the same carrying arm device does not suck the film substrates 2, 2 in both states before and after plasma processing, contamination due to suction can be prevented.

While sucking and holding a pair of film substrates 2, 2, the substrate carrying-out slider 9 is moved between a substrate carrying-out preparation position C inside the plasma processing apparatus main body 10 and a substrate carrying-out position D outside the plasma processing apparatus main body 10 by the drive of a drive device such as a motor or an air cylinder. The method of holding a pair of film substrates 2, 2 is not limited to suction, but they may be held by other means, for example, an engaging member or the like.

In the first chamber 8A, a pair of film substrates 2, 2 are carried in by a pair of the first carrying arm devices 3A, a lid 8a is closed by a lid opening/closing device 995 for the first chamber, an evacuation ON/OFF valve Sv1 for the first chamber is opened, the first chamber 8A is evacuated of gases by an evacuation device Rp to reduce pressure, reaction gases such as Ar and oxygen gases are introduced from the reaction gas supply device 998 into the first chamber 8A by opening a reaction gas ON/OFF valve SGv1 for the first chamber, and then high frequency power is applied from a high frequency power source 8c for the first chamber to the substrate electrode 8b to generate plasma in the first chamber 8A so that each surface of the pair of film substrates 2, 2 is subjected to plasma processing. Then, after atmospheric pressure is recovered by opening the first chamber 8A to the atmosphere or the like, the lid 8a is opened by the lid opening/closing device 995 for the first chamber, and the pair of film substrates 2, 2 are carried out by the second carrying arm device 3B.

In the second chamber 8B, a pair of film substrates 2, 2 are carried in by a pair of the first carrying arm devices 3A, a lid 8a is closed by a lid opening/closing device 996 for the second chamber, an evacuation ON/OFF valve Sv2 for the second chamber is opened, the second chamber 8B is evacuated of gases by the evacuation device Rp to reduce pressure, reaction gases are introduced from the reaction gas supply device 998 into the second chamber 8B by opening a reaction gas ON/OFF valve SGv2 for the second chamber, and then high frequency power is applied from a high frequency power source 8c for the second chamber to the substrate electrode 8b to generate plasma so that each surface of the pair of film substrates 2, 2 is subjected to plasma processing. Then, atmospheric pressure is recovered by opening the second chamber 8B to the atmosphere or the like, then the lid 8a is opened by the lid opening/closing device 995 for the second chamber, and the pair of film substrates 2, 2 are carried out by the second carrying arm device 3B.

Under the operation control of the controller 20, plasma processing can be performed independently in the first chamber 8A and the second chamber 8B. Therefore, for example, when plasma processing is being performed in one chamber under the operation control of the controller 20, film substrates 2 for which plasma processing is completed in the other chamber is carried out, and film substrates 2 for which plasma processing is to be performed next can be carried in. The lids 8a, 8a of the first and second chambers are opened or closed by the drive of lid opening/closing air cylinders 30, 30 as one example of the lid opening/closing devices 996 for the first and second chambers.

Figure 3:
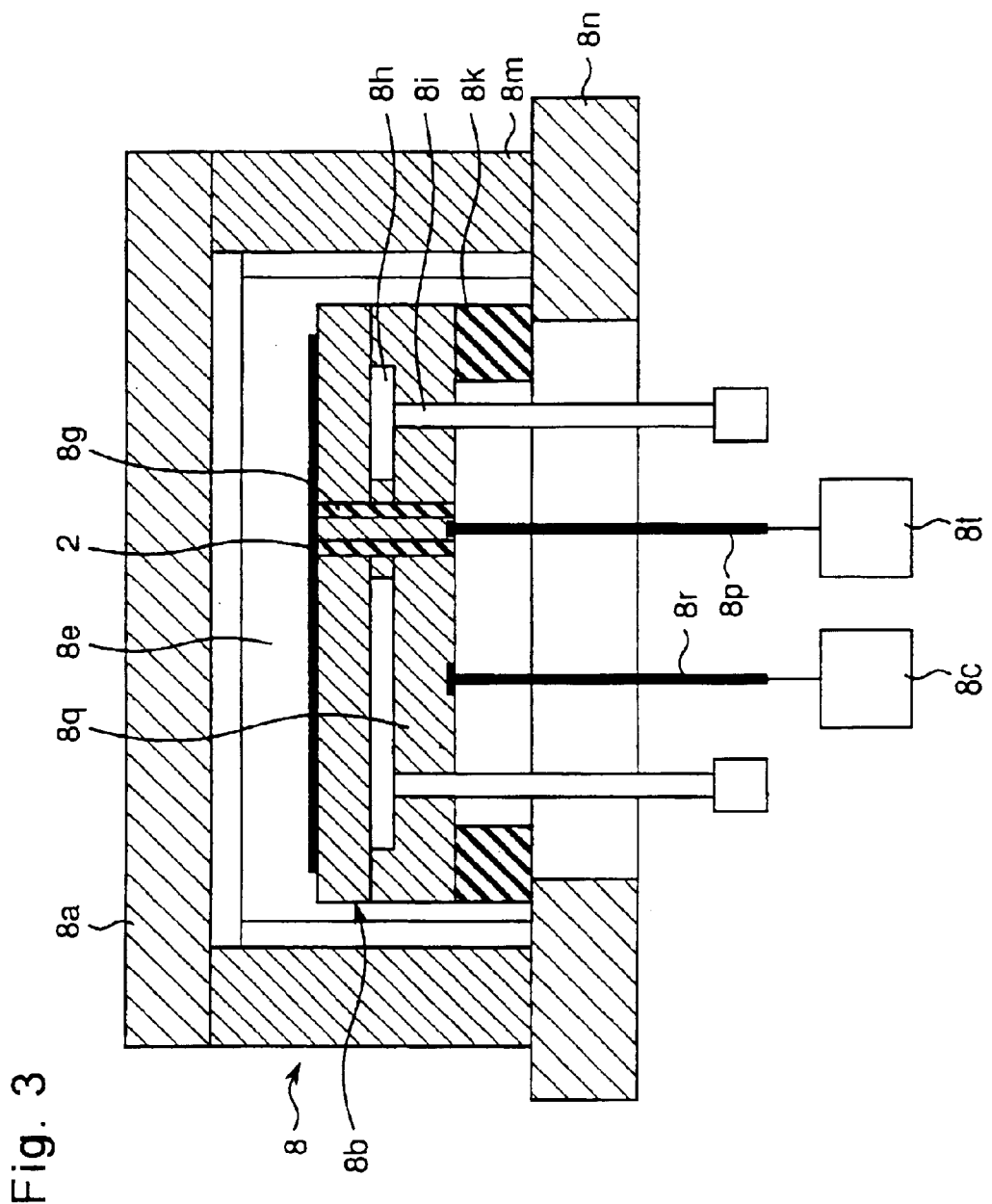
FIG. 3 is a cross sectional view showing a substrate electrode of the plasma processing apparatus.

The first chamber 8A and the second chamber 8B have the same constitution, and the chamber 8 is shown in FIG. 3. In FIG. 3, reference numeral 8a denotes a lid of the chamber 8, which is opened or closed by being vertically slid. Reference numeral 8e is a quartz cover disposed on an inner surface of a sidewall of the chamber 8. Reference numeral 8g denotes an insulating member for insulating a DC electrode for substrate electrostatic chuck from a substrate electrode 8b main body, to which high frequency power is applied. Reference numeral 8h denotes a cooling water channel for cooling the substrate electrode 8b. Reference numeral 8i denotes a cooling water pipe for supplying cooling water to the cooling water channel. Reference numeral 8k denotes an insulator constituted by alumina or the like for insulating the substrate electrode 8b from the chamber 8. Reference numeral 8m denotes a sidewall of the chamber 8 constituted by SUS304 or the like. Reference numeral 8n denotes a base of the chamber 8 constituted by SUS304 or the like. Reference numeral 8p denotes a DC electrode for substrate electrostatic chuck connected to a DC power source 8t for substrate electrostatic chuck. Reference numeral 8q denotes a water-cooling jacket constituted by SUS304 or the like for forming the cooling water channel of the substrate electrode 8b. Reference numeral 8r denotes a high frequency applied electrode connected to the high frequency power source 8c. The sidewall 8m, base 8n, and lid 8a of the chamber 8 are grounded. Therefore, when a film substrate 2 is placed on the substrate electrode 8b in the chamber 8, a DC voltage is applied from the DC power source 8t for substrate electrostatic chuck to the DC electrode 8p for substrate electrostatic chuck, and the film substrate 2 is sucked and held on the substrate electrode 8b by electrostatic chuck (electrostatic suction). During plasma processing, the film substrate 2 is thus held in an electrostatically chucked state. When the film substrate 2 is taken out after the completion of the plasma processing, application of the DC voltage to the DC electrode 8p for substrate electrostatic chuck is stopped or the voltage is allowed to act in an inverse direction so that the film substrate 2 can be readily taken out from the substrate electrode 8b.

This constitution is described in detail with reference to FIGS. 4 to 7. The following operation control is automatically performed under the operation control of the controller 20.

Figures 4, 5:
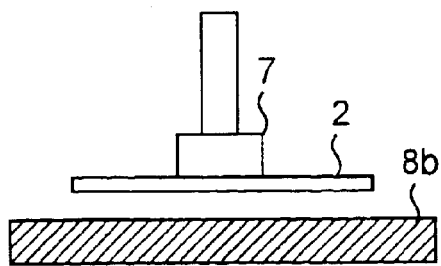
FIG. 4 is a timing chart showing operations of devices in the plasma processing apparatus when a film substrate is passed from a suction unit to the electrode.
FIG. 5 is an explanatory view showing the operations of the devices in the plasma processing apparatus when the film substrate is passed from the suction unit to the electrode in FIG. 4.

As shown in FIGS. 4 and 5, when film substrates 2 are delivered from the suction units 7 to the substrate electrode 8b, the suction units 7 sucking and holding the film substrates 2 are lowered to a lower end position by a suction unit elevator 7a, and the film substrates 2 are positioned immediately above the substrate electrode 8b. In this state, application of a DC voltage for electrostatic chuck to the substrate electrode 8b is started, and the voltage is stabilized at a predetermined voltage value. Then, suction and holding of the film substrates 2 by the suction units 7 is released, and a blow is performed for the film substrates 2 at the suction units 7 by a blow device 890. The film substrates 2 are reliably separated from the suction unit 7, and the film substrates 2 are electrostatically chucked to the substrate electrode 8b by an electrostatic chuck force at the same time. As a result, no unnecessary force is allowed to act on the film substrates 2, and the film substrates 2 can be smoothly delivered from the suction units 7 to the substrate electrode 8b.

Figure 6:
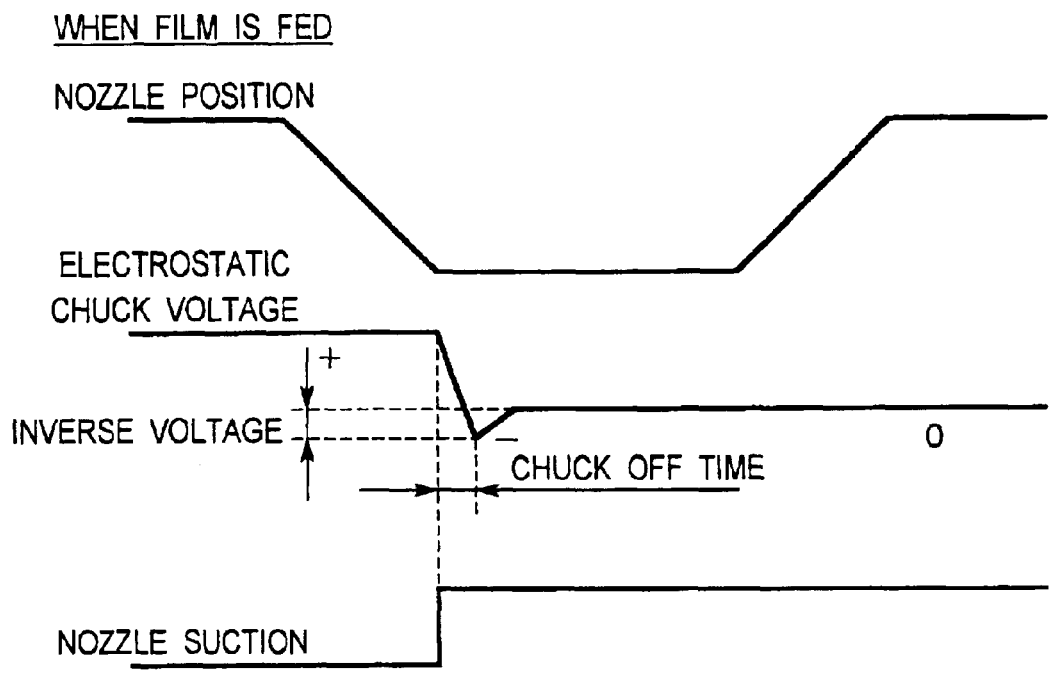
FIG. 6 is an explanatory view showing operations of the devices in the plasma processing apparatus when the film substrate is passed from the electrode to the suction unit.
Figure 7:
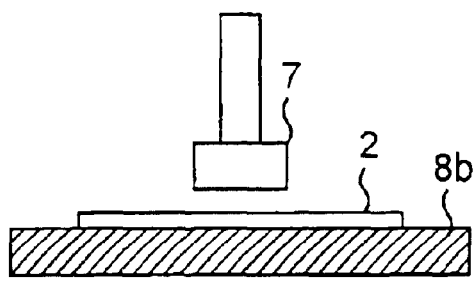
FIG. 7 is an explanatory view showing the operations of the devices in the plasma processing apparatus when the film substrate is passed from the electrode to the suction unit in FIG. 6.

On the other hand, as shown in FIGS. 6 and 7, when the film substrates 2 are delivered from the substrate electrode 8b to the suction units 7 on the contrary, the suction units 7 are lowered to the lower end position by the suction unit elevator 7a, and the suction units 7 are positioned immediately above the film substrates 2 electrostatically chucked by the substrate electrode 8b. In this state, application of a DC voltage for electrostatic chuck is started stopping, and suction and holding of the film substrates 2 by the suction units 7 is started at the same time, and the film substrates 2 are sucked and held by the suction units 7. A voltage inverse to the DC voltage for electrostatic chuck is applied to the substrate electrode 8b so that the film substrates 2 are reliably separated from the substrate electrode 8b. As a result, no unnecessary force is allowed to act on the film substrates 2, and the film substrates 2 can be smoothly delivered from the substrate electrode 8b to the suction units 7.

A piping system and plasma processing operations such as supply of evacuation gases into each chamber 8A, 8B are described below with reference to FIGS. 8, 9, and 29. These processing operations are also automatically performed under the operation control of the controller 20.

Figure 8:
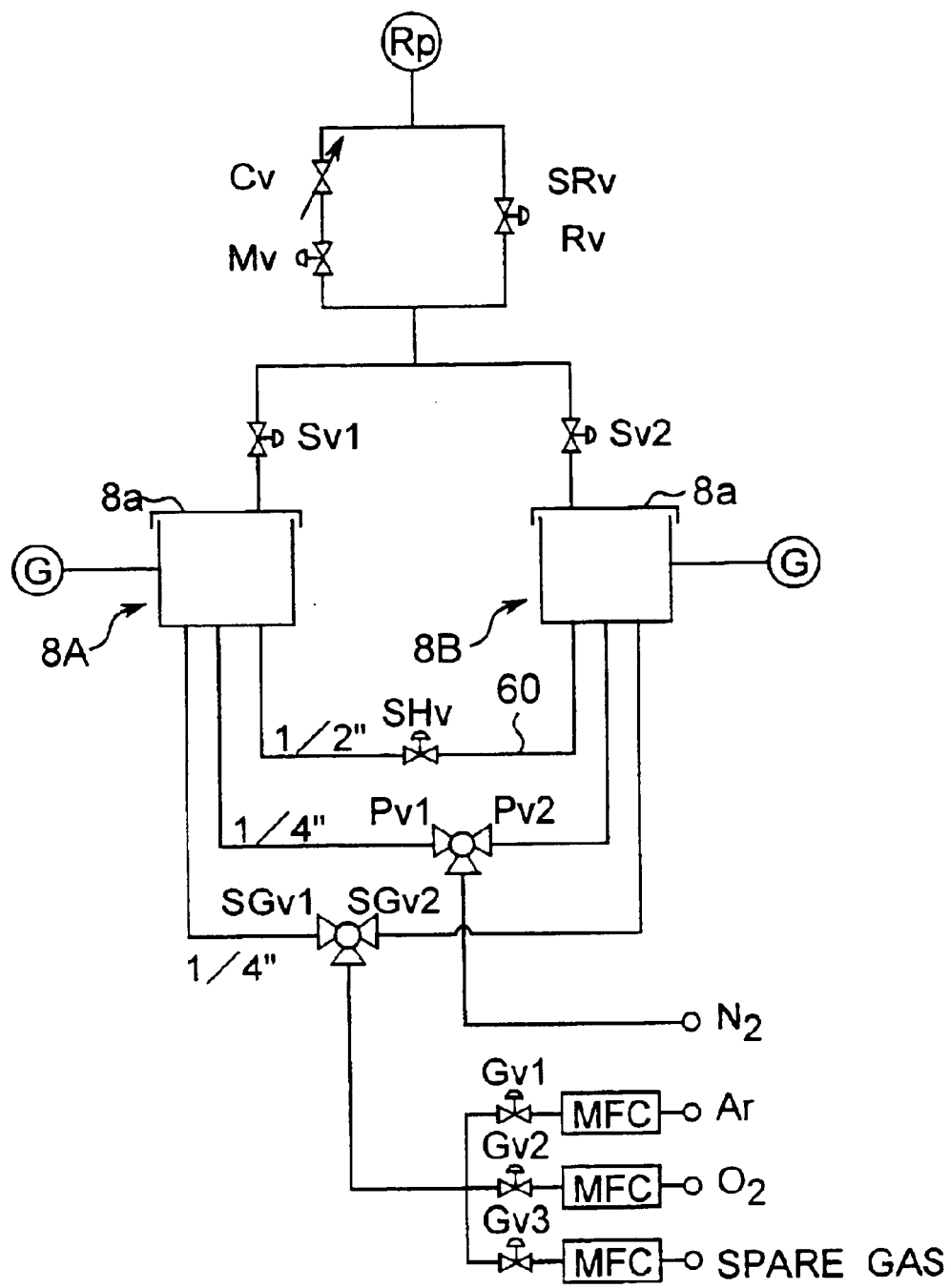
FIG. 8 is view showing a piping system of the plasma processing apparatus.
Figure 9:
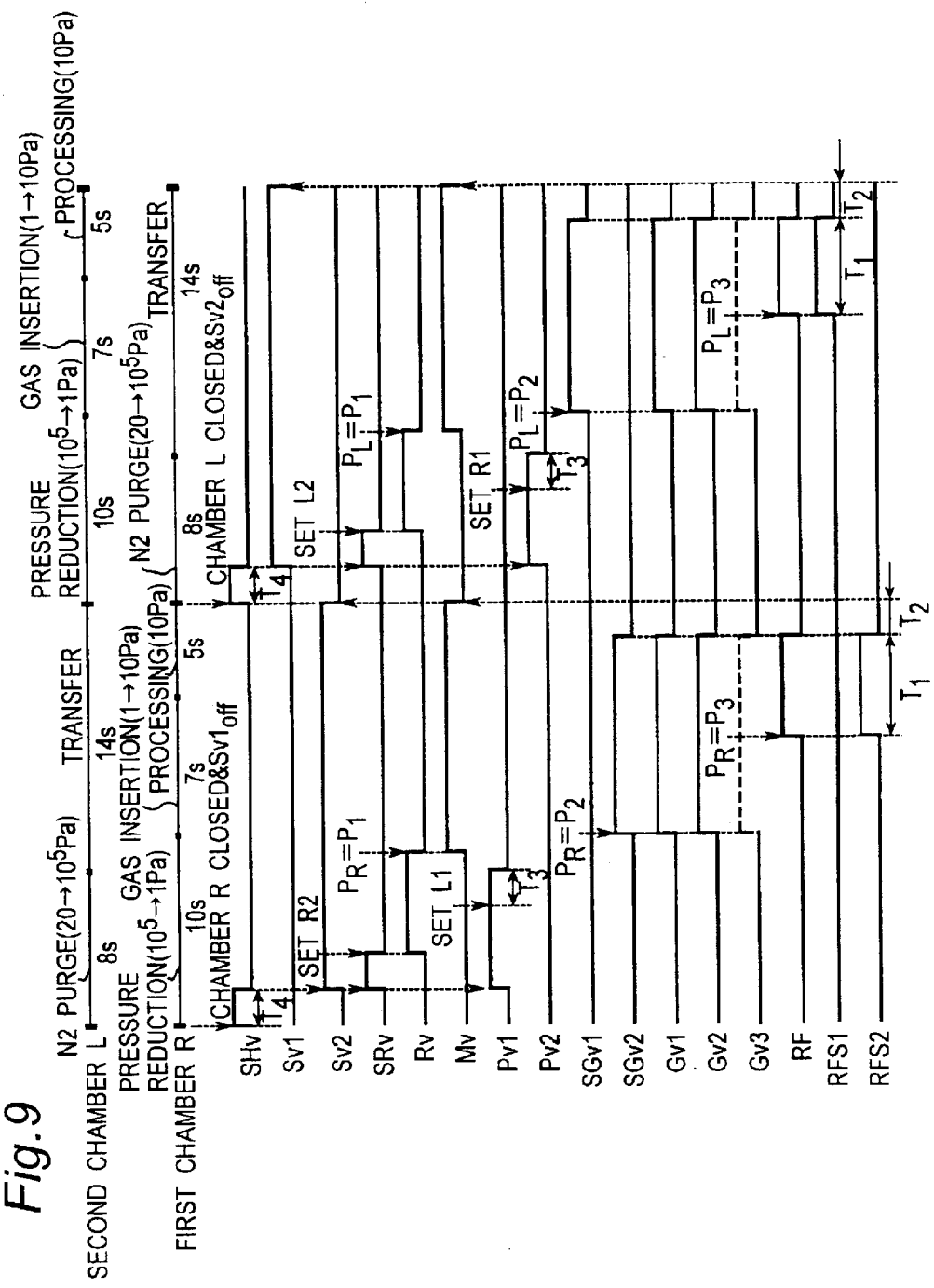
FIG. 9 is a timing chart showing operations of devices and opening and closing operations of valves in the piping system of the plasma processing apparatus.
Figure 10:
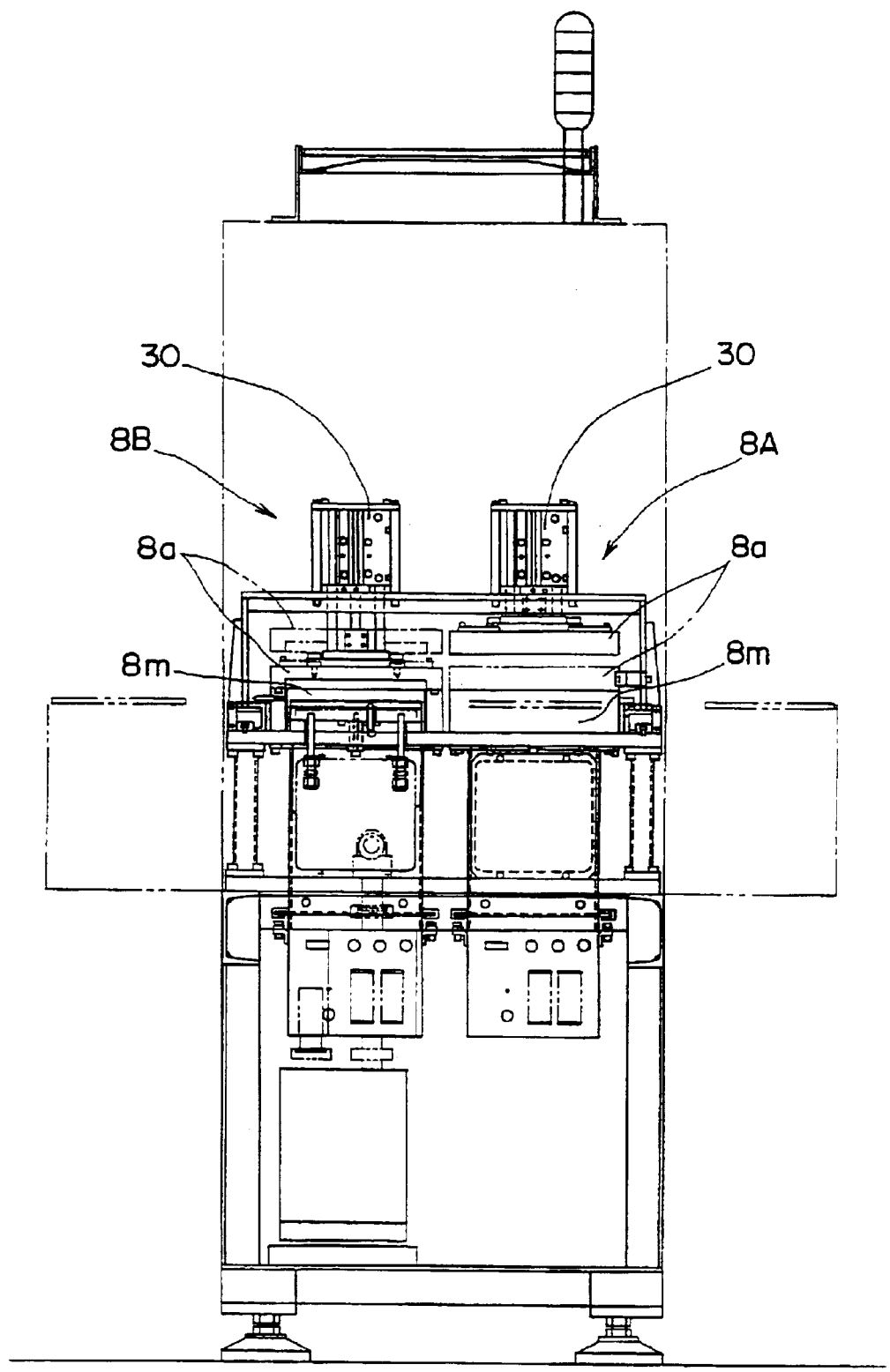
FIG. 10 is a detailed front view showing the plasma processing apparatus.
Figure 11:
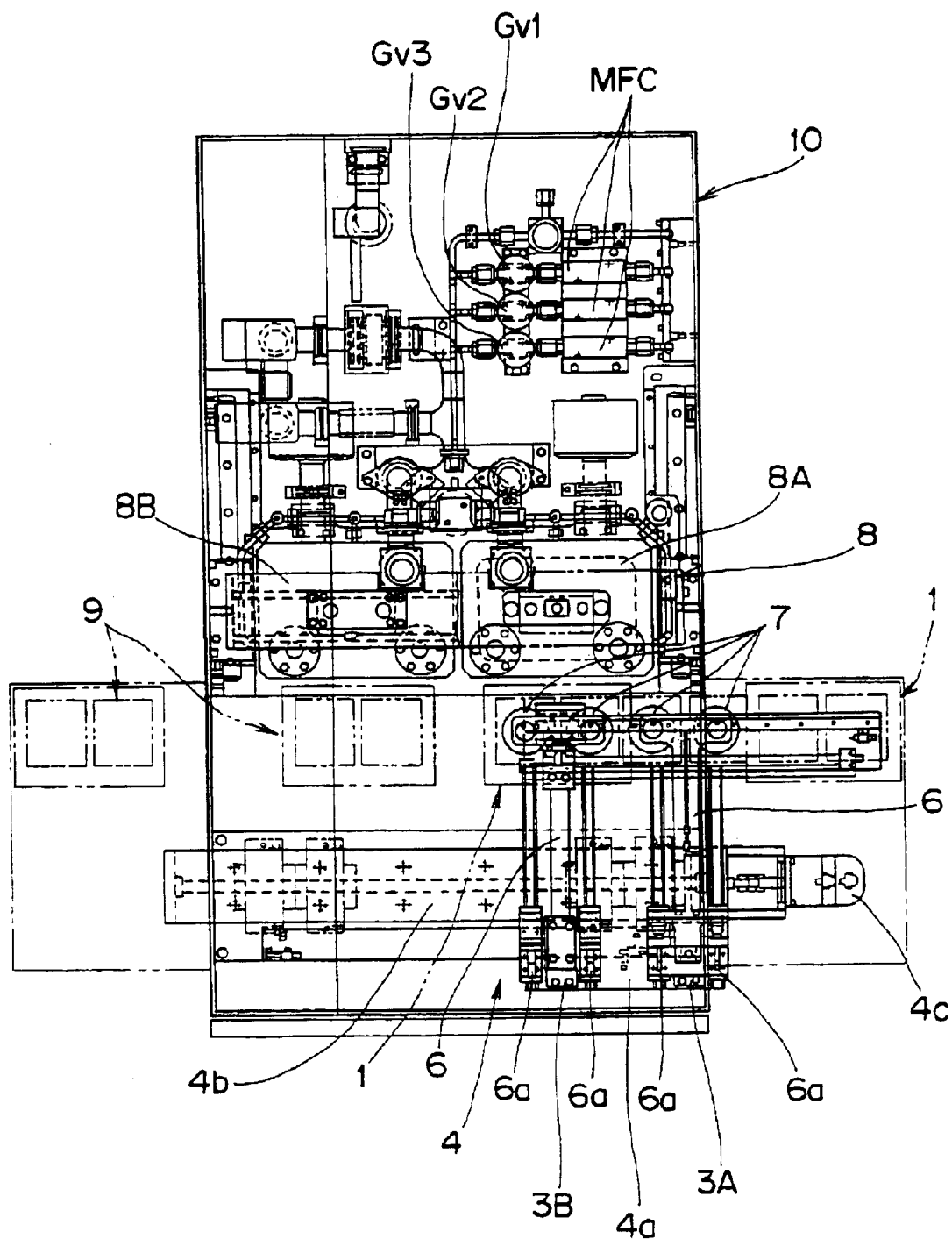
FIG. 11 is a detailed plan view showing the plasma processing apparatus.
Figure 12:
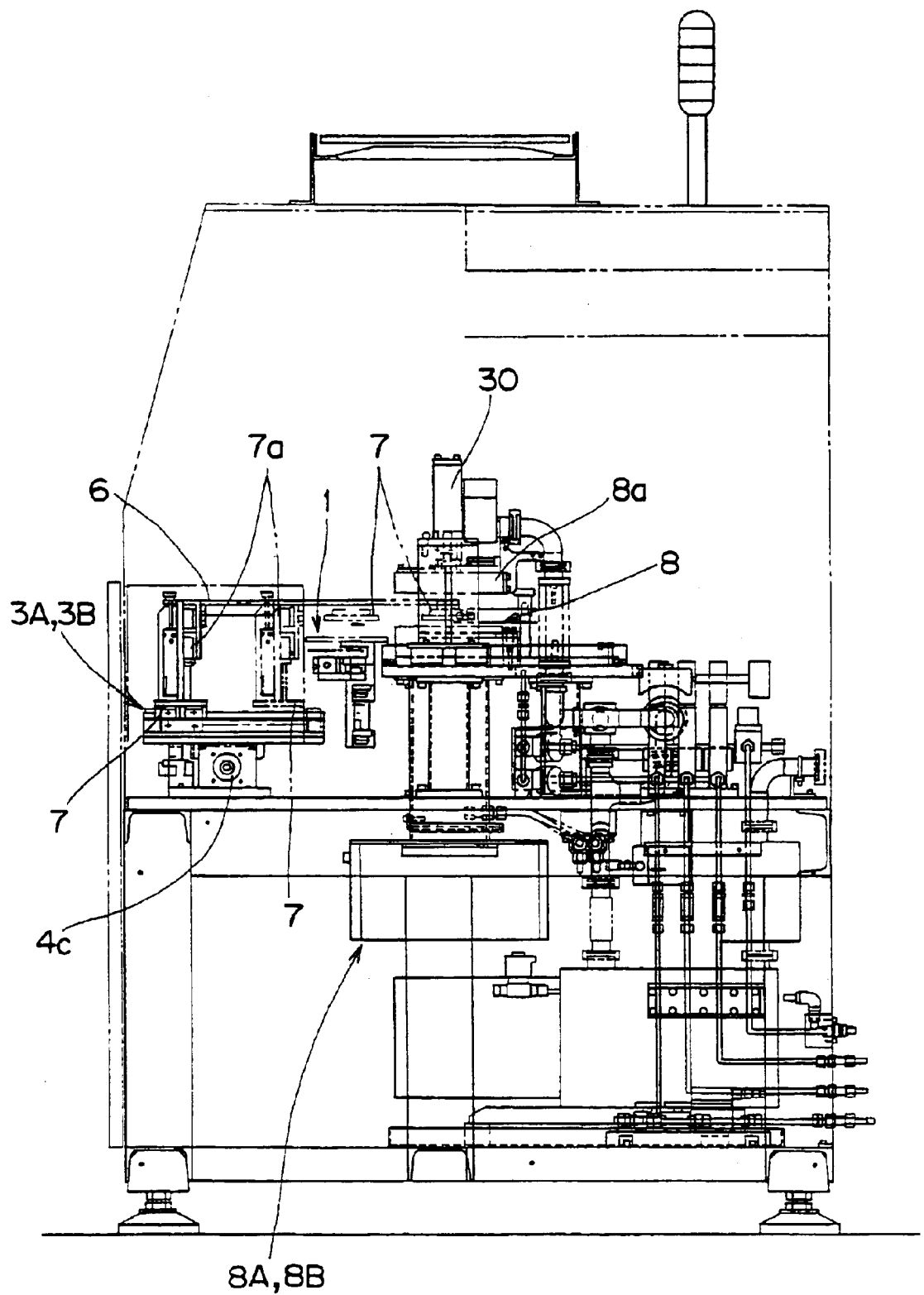
FIG. 12 is a detailed right-side view showing the plasma processing apparatus.
Figure 13:
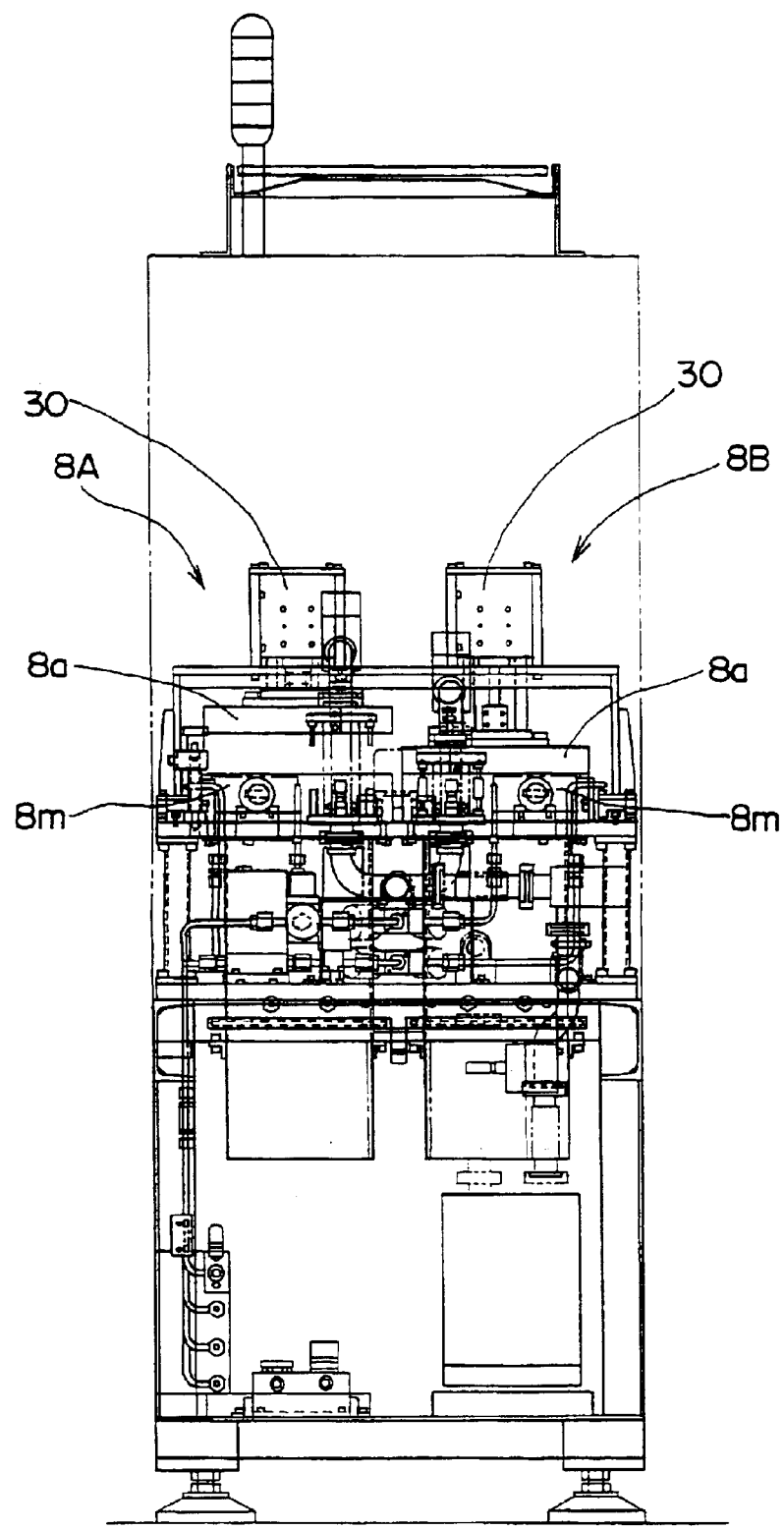
FIG. 13 is a detailed rear view showing the plasma processing apparatus.

In FIGS. 8, 9, and 29, Rp is an evacuation pump for both the chambers 8A, 8B. Mv is a control valve in an evacuation operation by the evacuation pump Rp. Cv is a flow control valve in the evacuation operation. Pressure is adjusted by the control valve Mv and the flow control valve Cv so that a predetermined low pressure state can be maintained after roughing. SRv and Rv are a slow roughing operation control valve and a roughing operation control valve, respectively, for the evacuation operation. Sv1 is an evacuation ON/OFF valve for the first chamber for the evacuation operation. Sv2 is an evacuation ON/OFF valve for the second chamber for the evacuation operation. G is a vacuum gauge for measuring pressure in each chamber. Furthermore, SHv is a direct connection valve (short valve) that functions as an opening/closing valve, and directly connects the first chamber 8A and the second chamber 8B by a communicating tube 60 so that recovery from a low pressure state to an atmospheric pressure state is accelerated. Pv1 and Pv2 are switching valves for a nitrogen gas that can supply a nitrogen gas to the first chamber 8A and the second chamber 8B, respectively, by switching the valves. Furthermore, SGv1 and SGv2 are switching valves that can supply an Ar gas, oxygen gas, or the like to the first chamber 8A and the second chamber 8B, respectively, by switching the valves. Gv1, Gv2, and Gv3 are ON/OFF valves for the Ar gas, oxygen gas, and a spare gas, respectively. MFC is a flow control valve for the Ar gas, oxygen gas, and a spare. In FIG. 9, RF is a high frequency power source. "SET L1" is an atmospheric pressure set point of the second chamber 8B. "SET L2" is a slow evacuation pressure set point of the second chamber 8B. PL is pressure of the second chamber 8B. Furthermore, "SET R1" is an atmospheric pressure set point of the first chamber 8A. "SET R2" is a slow evacuation pressure set point of the first chamber 8A. PR is pressure of the first chamber 8A. Furthermore, P1 is an ON pressure (Pa) of a main valve, which means completion of roughing. P2 is background pressure (Pa). P3 is plasma processing pressure (Pa). Furthermore, T1 is a plasma processing time (s). T2 is a gas evacuation time (s). T3 is a purge stabilization time (s), during which excessive purge is performed to easily open the lid 8a. T4 is a short time (s), during which both the chambers 8A, 8B are communicated.

Figure 28:
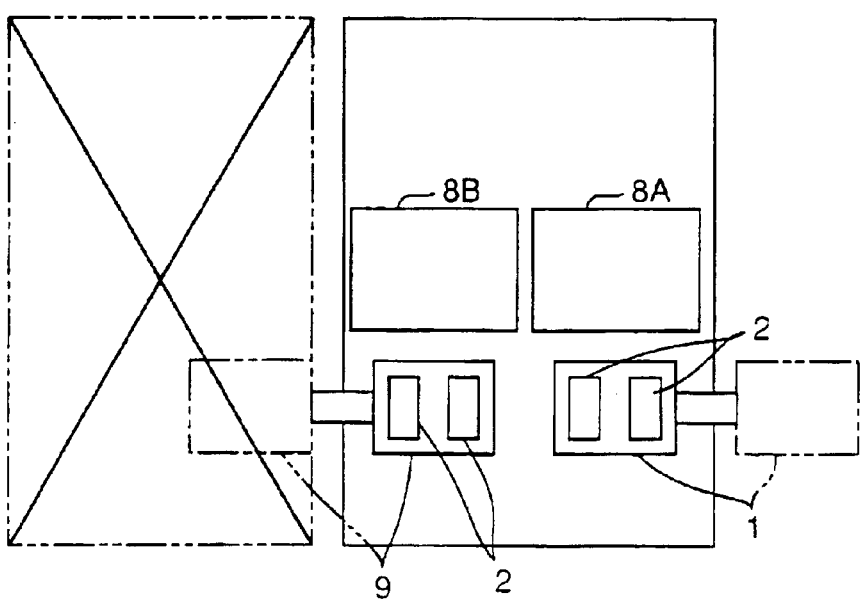
FIG. 28 is an explanatory view for explaining handling of a film substrate on a slider in the case where the film substrate is positioned on the slider and an apparatus for a subsequent step adjacent to the plasma processing apparatus is stopped due to a trouble or the like which is yet another modification of the above embodiment of the present invention.

Therefore, when an evacuation operation is performed in the first chamber 8A, the evacuation ON/OFF valve Sv1 for the first chamber is left open. When an evacuation operation is performed in the second chamber 8B, the evacuation ON/OFF valve Sv2 for the second chamber is left open. In this embodiment, either one evacuation ON/OFF valve Sv is opened, and two evacuation ON/OFF valves Sv are not opened at the same time, but the method is not limited to this. Then, when the evacuation pump Rp is driven to start an evacuation operation, the slow roughing operation control valve SRv is opened to first perform a slow roughing operation as shown in FIGS. 9 and 28. When pressure of a vacuum gauge G of the first or second chamber 8A or 8B to be evacuated becomes SET R2 or SET L2, the slow roughing operation control valve SRv is closed, and the roughing operation control valve Rv is opened. As a result, such effects can be obtained that a rapid flow of air into a rotary pump, which is the evacuation pump Rp, is prevented, and splashing of oil, damage to a pump, and scattering of particles in the chamber are prevented.

Then, after pressure PR or PL of the first or second chamber 8A or 8B is measured by the vacuum gauge G of the first or second chamber BA or 8B to reach a main valve ON pressure P1, the roughing operation control valve Rv is closed and a low pressure state is controlled by the control valve Mv and the flow control valve Cv. Then, after the pressure PR or PL of the first or second chamber 8A or 8B becomes background pressure P2, the switching valve SGv1 or SGv2 is switched, the flow control valve MFC for an Ar gas and the ON/OFF valve Gv1 for an Ar gas, the flow control valve MFC for an oxygen gas and the ON/OFF valve Gv2 for an oxygen gas, and the spare gas flow control valve MFC and the spare gas ON/OFF valve Gv3 are appropriately operated to supply an Ar gas, oxygen gas, or the like to the chamber 8 in the predetermined low pressure state.

After this supply of an Ar gas, oxygen gas, or the like, and the gas introduction operation is stabilized, the high frequency power is applied to the substrate electrode 8b to generate plasma in the chamber 8 so that plasma processing is performed for connection portions such as electrodes of the film substrates 2, 2. After plasma processing is performed only for a predetermined plasma processing time T1, the supply of an Ar gas, oxygen gas, or the like is stopped to evacuate for a gas evacuation time T2. Then, a switching valve Pv1 or Pv2 for a nitrogen gas is switched so that the nitrogen gas is supplied to the chamber 8 in a predetermined low pressure to perform nitrogen purge. At this time, when the nitrogen purge is started, a direct connection valve SHv of the communicating tube 60 for communicating the first chamber 8A and the second chamber 8B is opened, the chamber 8A or 8B in which plasma processing has been performed and the chamber 8B or 8A immediately after an evacuation operation for plasma processing is started by closing the lid 8a are communicated so that the chamber 8A or 8B in which plasma processing has been performed can be rapidly recovered from the low pressure state to an atmospheric pressure state (since carrying-in environment of the film substrates 2, 2 into the chamber 8 by opening the lid 8a has a nitrogen atmosphere, a nitrogen purge operation in the chamber 8A or 8B in which the plasma processing has been performed is not affected).

In the plasma processing apparatus described above, the substrate carrying-in slider 1, carrying arm device 3A, B, moving device 4, first chamber 8A, second chamber 8B, respective high frequency power sources 8c, respective DC power sources for substrate electrostatic chuck, substrate carrying-out slider 9, and so forth are connected to the controller 20 so that operations thereof are controlled by the controller 20.

Figure 14:
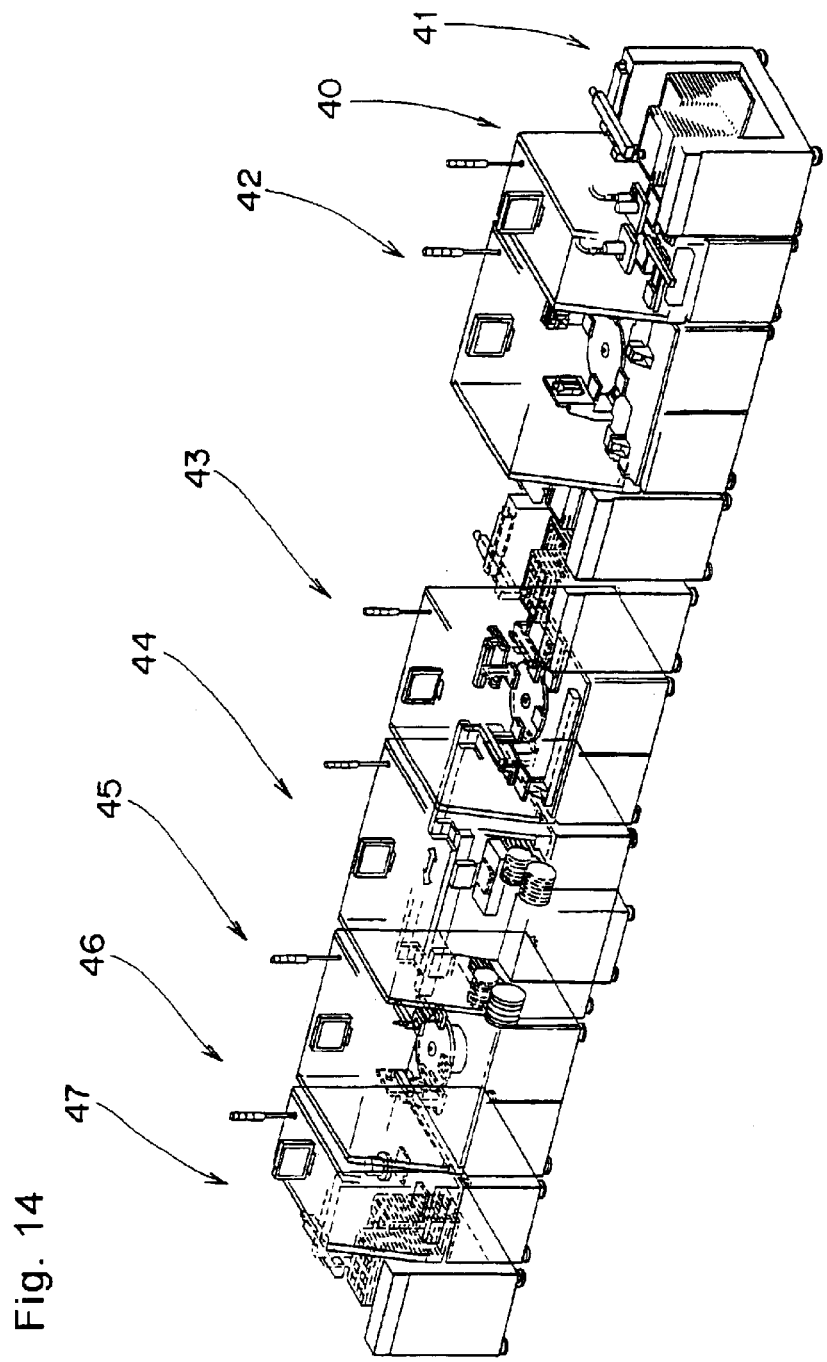
FIG. 14 is a perspective view showing one example of a position of the plasma processing apparatus in a component-mounted substrate production line.

Furthermore, one example of a position of the plasma processing apparatuses in a production line of a component-mounted substrate (board) is shown in FIG. 14. In FIG. 14, reference numeral 41 denotes a loader, in which each of a large number of film substrates 2, . . . , 2 is housed and fed out one by one along a substrate carrying direction F. Reference numeral 40 denotes the plasma processing apparatus for subjecting the film substrates 2 to the plasma processing in units of two. Reference numeral 42 denotes an IC bonder for mounting an IC chip on each film substrate 2 subjected to plasma processing via an ACF (anisotropic conductive film). Reference numeral 43 denotes a bonding agent applying device for applying a bonding agent to predetermined sites of each film substrate 2. Reference numeral 44 denotes a component mounting device for mounting components to the predetermined sites or the like of the film substrate 2 on which the bonding agent is applied. Reference numeral 45 denotes an FPC bonder for bonding the film substrate 2 and an LCD (liquid crystal display) to manufacture a product. Reference numeral 46 denotes an inspecting device for inspecting carried-in products. Reference numeral 47 denotes an unloader for housing products carried one by one along the substrate carrying direction F.

Operations of the plasma processing apparatus performed automatically under the operation control of the controller 20 are described in detail below with reference to FIGS. 2, 15 to 22, and 23.

Figure 15:
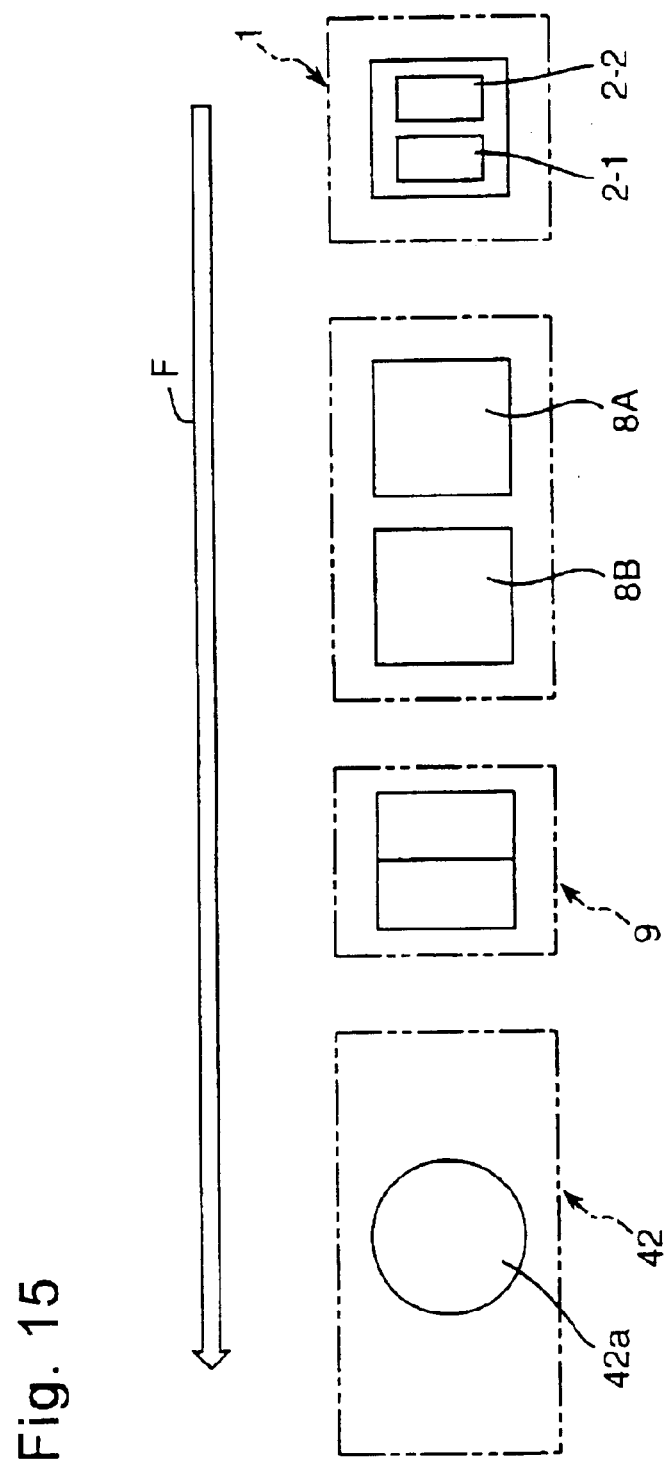
FIG. 15 is an explanatory view showing a series of operations of the plasma processing apparatus.

As shown in FIG. 15, it is assumed that a pair of film substrates 2, 2, that is, 2-1 and 2-2 are placed on the substrate carrying-in slider 1. The substrate carrying-in slider 1, on which the pair of film substrates 2-1, 2-2 are placed, is moved from a substrate carrying-in preparation position A to a substrate carrying-in position B and stopped (see (1)).

Subsequently, the pair of carrying arm devices 3A, 3B are moved by the moving device 4 along the substrate carrying direction F (see (2)), and the pair of suction units 7, 7 of the first carrying arm device 3A of the pair of carrying arm devices 3A, 3B are lowered towards the pair of film substrates 2-1, 2-2 on the substrate carrying-in slider 1 positioned at the substrate carrying-in position B, the pair of suction units 7, 7 suck and hold the substrates simultaneously, and are raised (see (3)).

Subsequently, the first carrying arm device 3A is moved to a next operation position along the substrate carrying direction F by the moving device 4 (see (4)), and the lid 8a of the second chamber 8B, in which plasma processing is completed, is opened (see (5)). In the case where there are the pair of film substrates 2, 2 already subjected to plasma processing in the second chamber 8B, the pair of film substrates 2, 2 subjected to plasma processing are sucked and held by the pair of suction units 7, 7 of the second carrying arm device 3B of the pair of carrying arm devices 3A, 3B, and taken out from the second chamber 8B (see (6)). The substrate carrying-out slider 9 is returned from a substrate carrying-out position D to a substrate carrying-out preparation position C before this operation (see (7)). Furthermore, the substrate carrying-in slider 1 is returned from the substrate carrying-in position B to the substrate carrying-in preparation position A, and, after next new film substrates 2-3, 2-4 are placed thereon, the substrate carrying-in slider 1 is returned to the substrate carrying-in position B (see (8) and FIG. 17).

Figure 16:
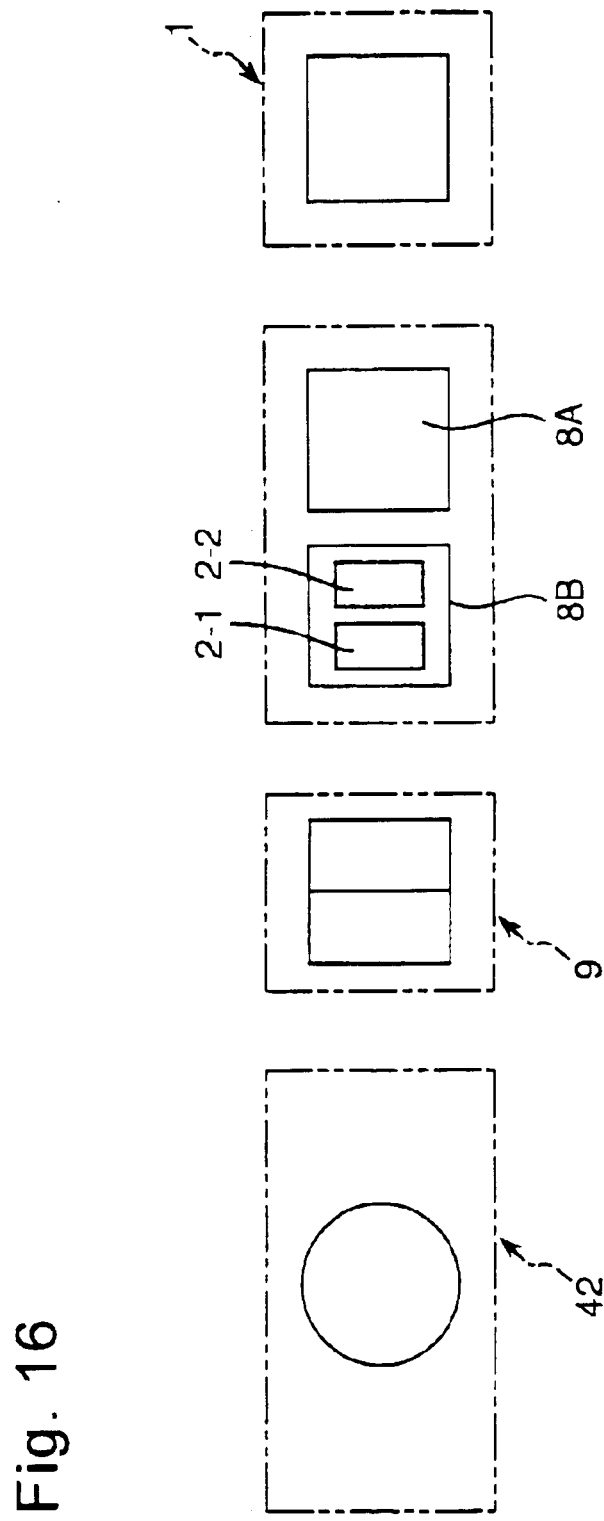
FIG. 16 is an explanatory view showing a series of operations of the plasma processing apparatus following FIG. 15.

Then, after moved along the substrate carrying direction F by the moving device 4 (see (9)), the first carrying arm device 3A is moved from above of the substrate carrying-in slider 1 to a position above the inside of the second chamber 8B with the lid 8a open, the pair of suction units 7, 7 of the first carrying arm device 3A are lowered from the position above the second chamber 8B to place the pair of film substrates 2-1, 2-2 on the substrate electrode 8b in the second chamber 8B as shown in FIG. 16, and raised and returned to the initial position (see (10)). In the second chamber 8B, the pair of film substrates 2-1, 2-2 are placed on the substrate electrode 8b, the lid 8a is closed (see (11)), and the second chamber 8B is evacuated to reduce pressure from $10^5$ Pa to 1 Pa. At the same time, a predetermined reaction gas is allowed to flow in to increase pressure from 1 Pa to 10 Pa, a predetermined pressure state of 10 Pa is maintained, and high frequency power is applied to generate plasma so that plasma processing is performed. After plasma processing, a nitrogen gas is allowed to flow in, pressure is increased from 20 Pa to $10^5$ Pa, and the lid 8a of the second chamber 8B is opened (see (5)).

Meanwhile, after the second carrying arm device 3B is further moved along the substrate carrying direction F by the moving device 4 (see (12)), the pair of film substrates 2, 2 that are sucked and held by the pair of suction units 7, 7 of the second carrying arm device 3B of the pair of carrying arm devices 3A, 3B and subjected to plasma processing are placed on the substrate carrying-in slider 1 positioned at the substrate carrying-in position B (see (13)). Subsequently, the pair of film substrates 2, 2 are placed on the substrate carrying-out slider 9, and then, the substrate carrying-out slider 9 is moved from the substrate carrying-out preparation position C to the substrate carrying-out position D (see (14)).

Figure 17:
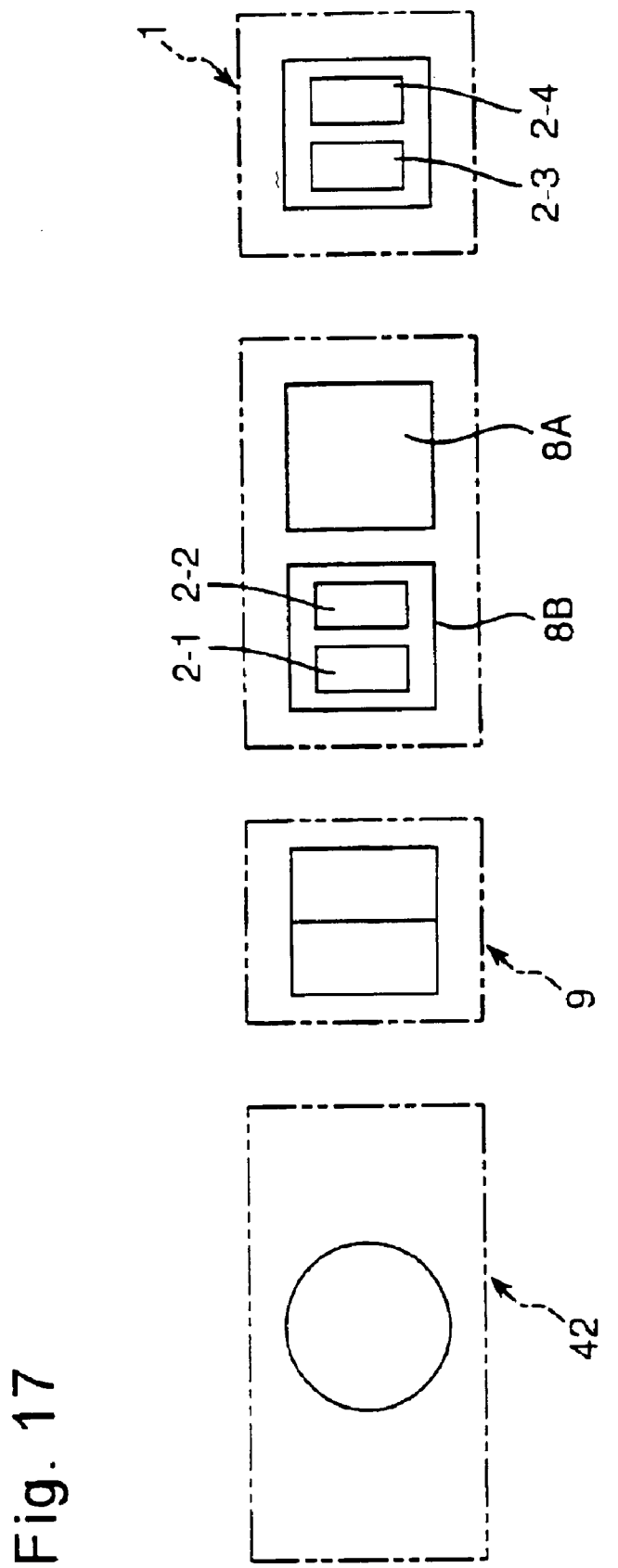
FIG. 17 is an explanatory view showing a series of operations of the plasma processing apparatus following FIG. 16.

Subsequently, after the pair of carrying arm devices 3A, 3B are moved by the moving device 4 along a direction opposite to the substrate carrying direction F (see (15)), as shown in FIG. 17, the pair of suction units 7, 7 of the first carrying arm device 3A of the pair of carrying arm devices 3A, 3B are lowered towards a pair of film substrates 2-2, 2-3 on the substrate carrying-in slider 1 positioned at the substrate carrying-in position B, suck and hold the substrates simultaneously, and then are raised (see (16)).

Subsequently, the first carrying arm device 3A is moved to the next operation position along the substrate carrying direction F by the moving device 4 (see (17)), and the lid 8a of the first chamber 8A, in which plasma processing is completed, is opened (see (18)). When there are already a pair of film substrates 2, 2 subjected to plasma processing in the first chamber 8A, the pair of film substrates 2, 2 subjected to plasma processing are sucked and held by the pair of suction units 7, 7 of the second carrying arm device 3B of the pair of carrying arm devices 3A, 3B, and taken out from the first chamber 8A (see (19)). The substrate carrying-out slider 9 is returned from the substrate carrying-out position D to the substrate carrying-out preparation position C before this operation (see (14)). Furthermore, the substrate carrying-in slider 1 is returned from the substrate carrying-in position B to the substrate carrying-in preparation position A, and, after next new film substrates 2, 2 are placed thereon, the substrate carrying-in slider 1 is returned to the substrate carrying-in position B (see (1)).

Figure 18:
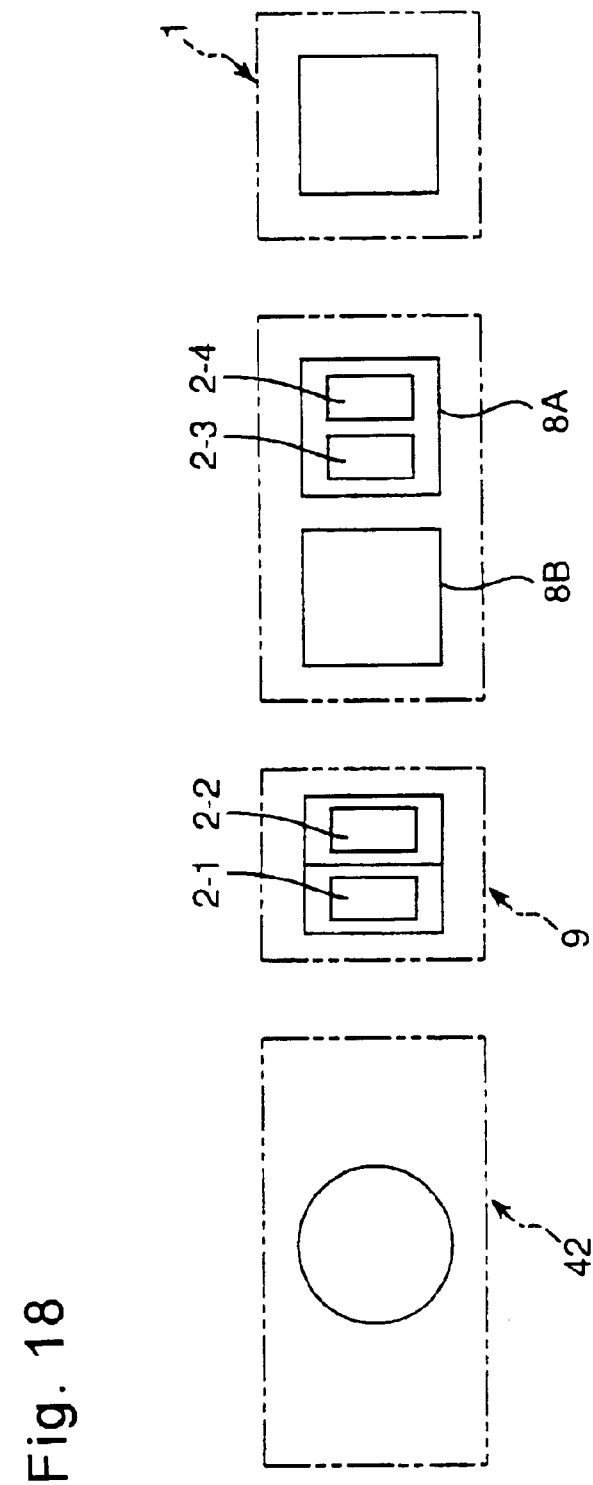
FIG. 18 is an explanatory view showing a series of operations of the plasma processing apparatus following FIG. 17.

Then, after moved along the substrate carrying direction F by the moving device 4 (see (20)), the first carrying arm device 3A is moved from above the substrate carrying-in slider 1 to the position above the inside of the first chamber 8A, of which lid 8a is opened, and the pair of suction units 7, 7 of the first carrying arm device 3A are lowered from the position above the first chamber 8A to place the pair of film substrates 2-3, 2-4 on the substrate electrode 8b in the first chamber 8A as shown in FIG. 18, then raised, and returned to the initial position (see (21)). In the first chamber 8A, after the pair of film substrates 2-3, 2-4 are placed on the substrate electrode 8b, the lid 8a is closed (see (22)), and the first chamber 8A is evacuated to reduce pressure from $10^5$ Pa to 1 Pa. At the same time, a predetermined reaction gas is allowed to flow in to increase pressure from 1 Pa to 10 Pa, a predetermined pressure state of 10 Pa is maintained, and high frequency power is applied to generate plasma so that plasma processing is performed. After plasma processing, a nitrogen gas is allowed to flow in, pressure is increased from 20 Pa to $10^5$ Pa, and the lid 8a of the first chamber 8A is opened (see (18)).

Figure 23:
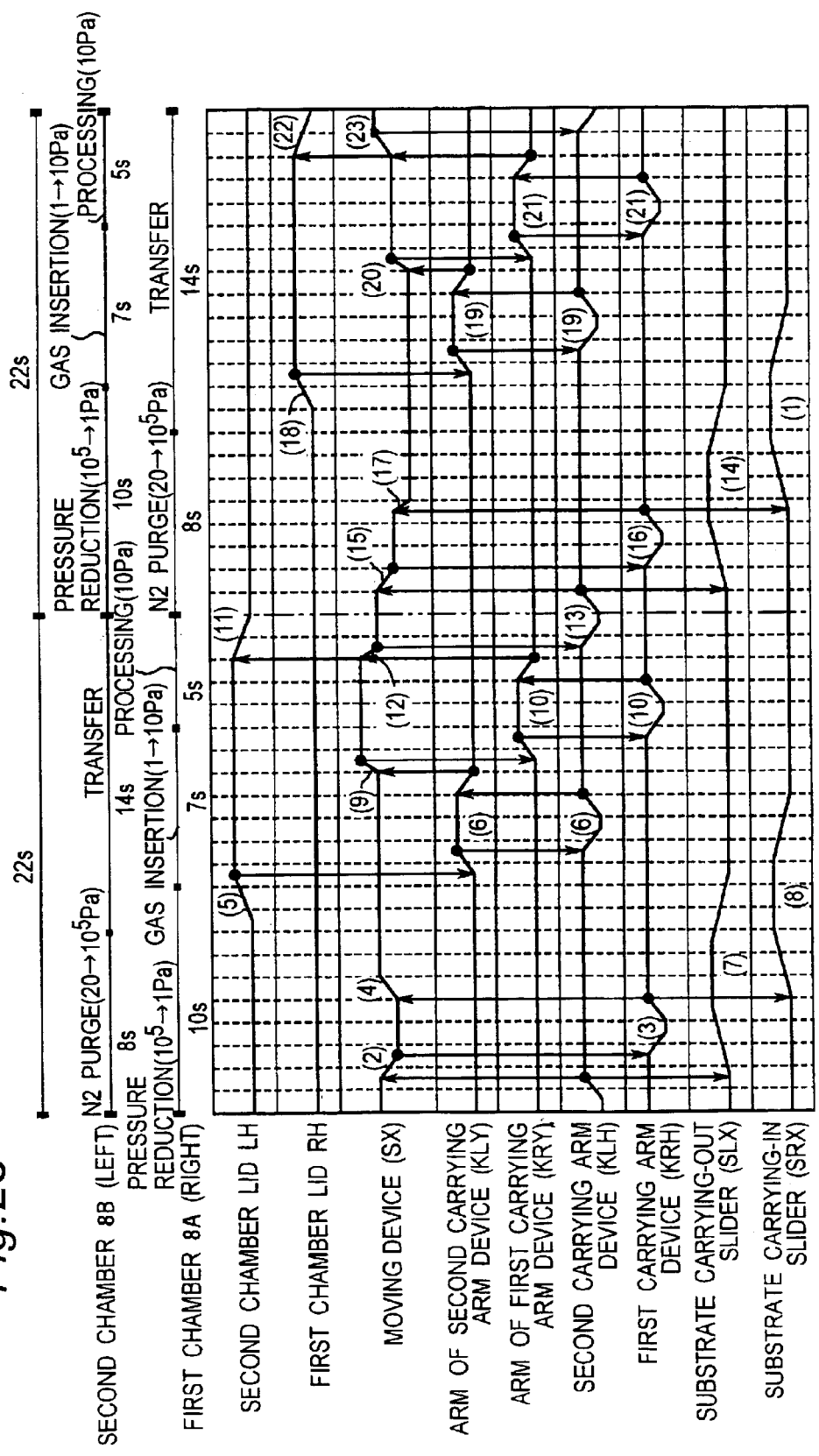
FIG. 23 is a timing chart showing a series of operations of the plasma processing apparatus.

Meanwhile, after the pair of carrying arm devices 3A, 3B are further moved along the substrate carrying direction F by the moving device 4 (see (23)), as shown in FIG. 18, the pair of film substrates 2-1, 2-2 that are sucked and held by the pair of suction units 7, 7 of the second carrying arm device 3B of the pair of carrying arm devices 3A, 3B and subjected to plasma processing are placed on the substrate carrying-out slider 9 positioned at the substrate carrying-out preparation position C (see (25)). Then, after the pair of film substrates 2, 2 are placed on the substrate carrying-out slider 9, the substrate carrying-out slider 9 is moved from the substrate carrying-out preparation position C to the substrate carrying-out position D (see (7)). Then, as shown in FIG. 23, the above operations are repeated.

Relations between the plasma processing apparatus and the IC bonder 42 disposed adjacent thereto are mainly described below.

Figure 19:
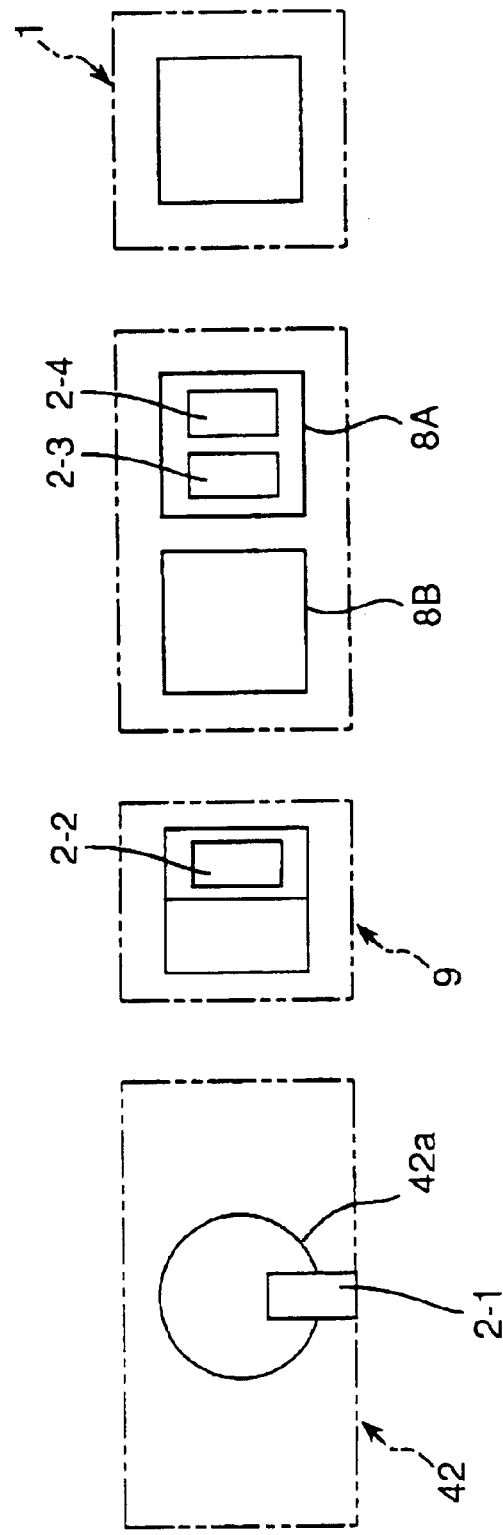
FIG. 19 is an explanatory view showing a series of operations of the plasma processing apparatus following FIG. 18.

Subsequently, as shown in FIG. 19, one film substrate 2-1 of the pair of film substrates 2-1, 2-2 on the substrate carrying-out slider 9 positioned at the substrate carrying-out position D is taken out, and carried in to a substrate feeding/taking-out position I of an adjacent component mounting device on a downstream side, for example, an IC bonder 42.

Figure 20:
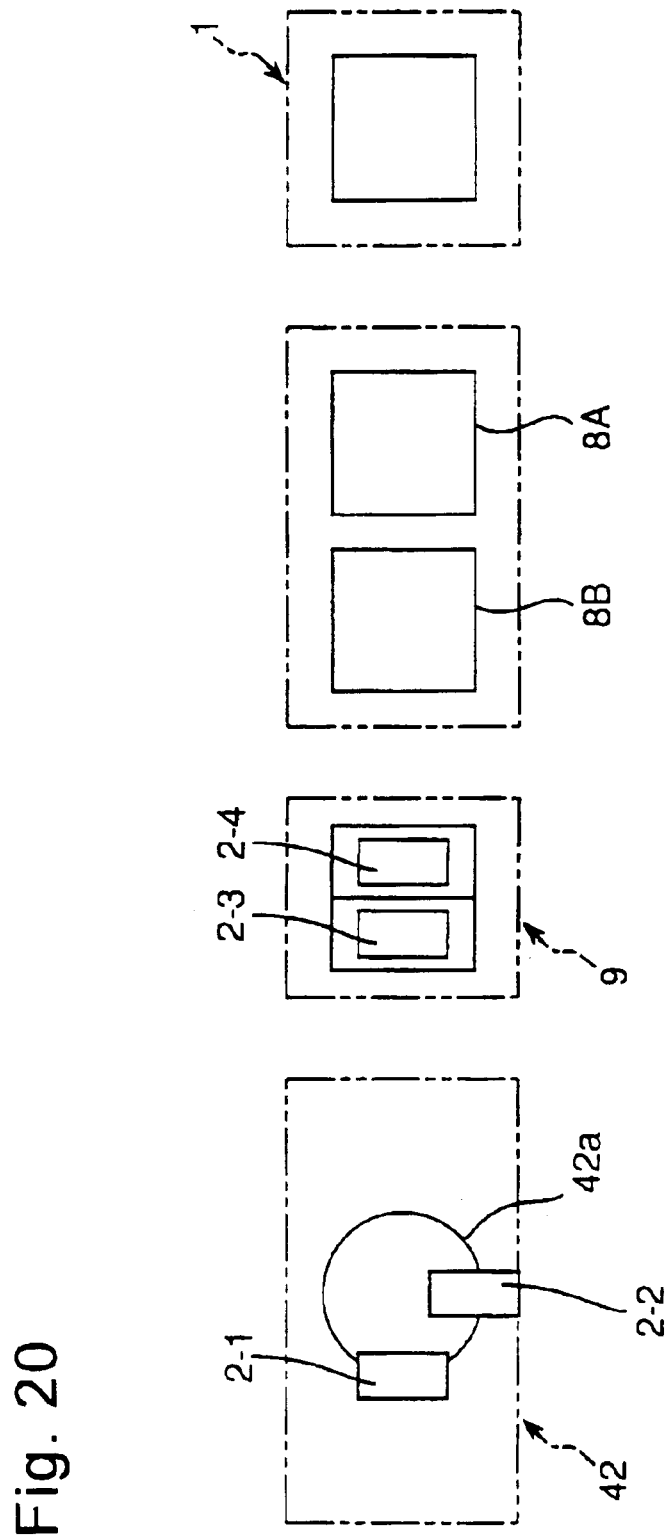
FIG. 20 is an explanatory view showing a series of operations of the plasma processing apparatus following FIG. 19.

Subsequently, as shown in FIG. 20, a substrate holding device 42a of the IC bonder 42 is intermittently rotated 90°, and the film substrate 2-1 fed to the substrate feeding/taking-out position I is positioned at an ACF sticking position II so that sticking of an ACF (anisotropic conductive film) on the film substrate 2-1 is started. At this time, the other film substrate 2-2 of the pair of film substrates 2-1, 2-2 on the substrate carrying-out slider 9 positioned at the substrate carrying-out position D is taken out and carried in to the substrate feeding/taking-out position I of the adjacent IC bonder 42 on the downstream side. During this operation, plasma processing of the pair of film substrates 2-3, 2-4 in the first chamber 8A is completed, and the pair of film substrates 2-1, 2-2 are taken out from the first chamber 8A by the pair of suction units 7, 7 of the second carrying arm device 3B and placed on the substrate carrying-out slider 9 positioned at the substrate carrying-out preparation position C.

Figure 21:
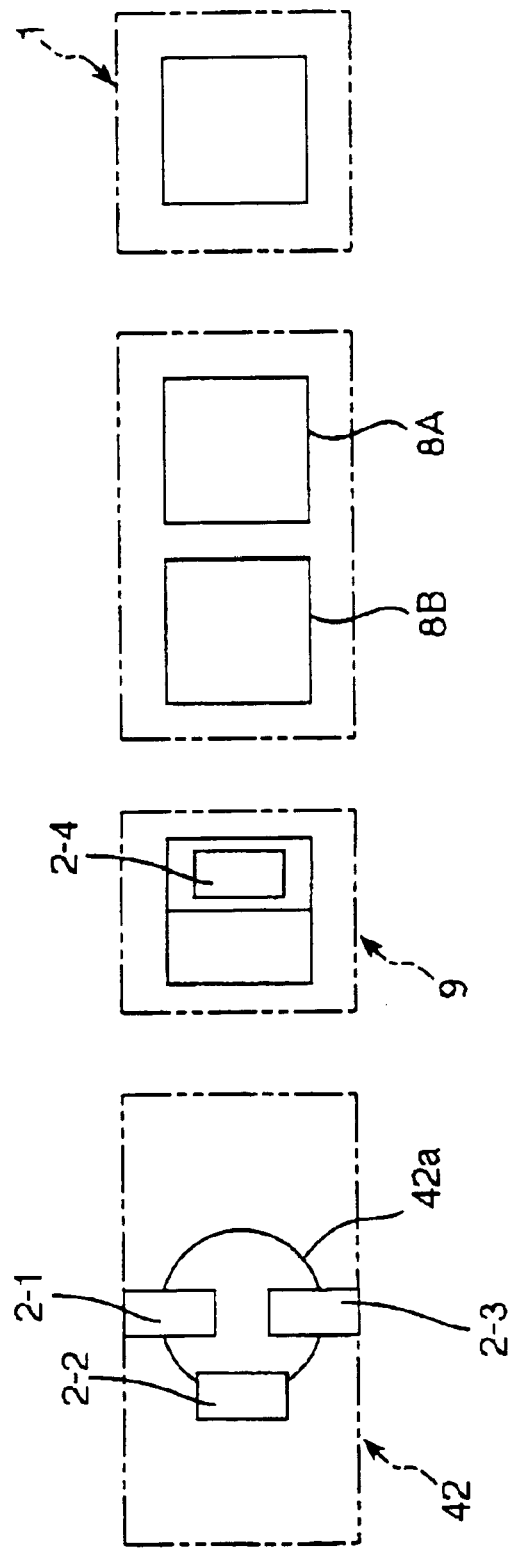
FIG. 21 is an explanatory view showing a series of operations of the plasma processing apparatus following FIG. 20.

Subsequently, as shown in FIG. 21, the substrate holding device 42a of the IC bonder 42 is further intermittently rotated 90°, and the film substrate 2-1 positioned at the ACF sticking position II is positioned at an inspection position III to start inspection. At the same time, the film substrate 2-2 fed to the substrate feeding/taking-out position I is positioned at the ACF sticking position II to start sticking of the ACF to the film substrate 2-2. At the same time, one film substrate 2-3 of the pair of film substrates 2-3, 2-4 on the substrate carrying-out slider 9 positioned at the substrate carrying-out position D is taken-out, and carried in to the substrate feeding/taking-out position I of the adjacent IC bonder 42 on the downstream side.

Figure 22:
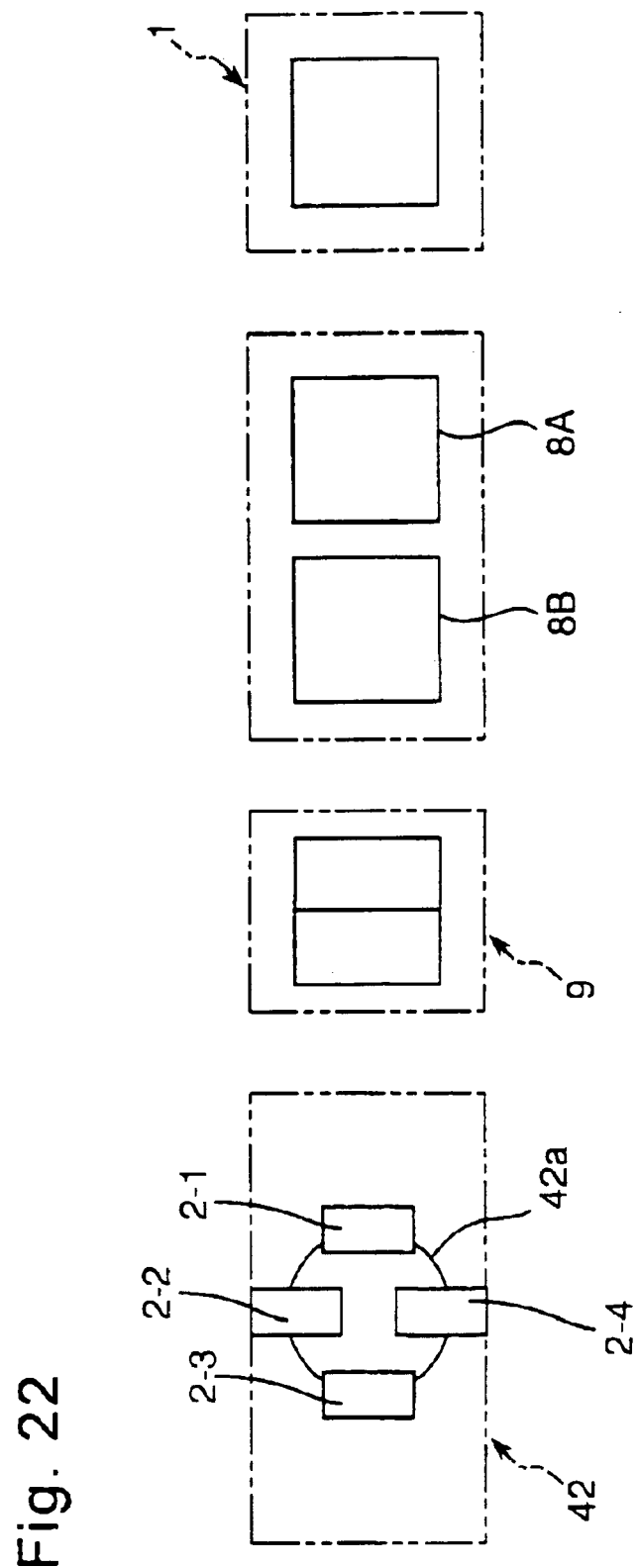
FIG. 22 is an explanatory view showing a series of operations of the plasma processing apparatus following FIG. 21.

Subsequently, as shown in FIG. 22, the substrate holding device 42a of the IC bonder 42 is further intermittently rotated 900, and the film substrate 2-1 positioned at the inspection position III is positioned at an IC placing position IV to place the IC chip to the film substrate 2-1 via the ACE, and the film substrate 2-2 positioned at the ACF sticking position II is positioned at the inspection position III to start inspection. At the same time, the film substrate 2-3 fed to the substrate feeding/taking-out position I is positioned at the ACF sticking position II to start sticking of the ACF to the film substrate 2-3. At the same time, the other film substrate 2-4 of the pair of film substrates 2-3, 2-4 on the substrate carrying-out slider 9 positioned at the substrate carrying-out position D is taken out and carried in to the substrate feeding/taking-out position I of the IC adjacent bonder 42 on the downstream side. Then, when the substrate holding device 42a of the IC bonder 42 is further intermittently rotated 90°, and the film substrate 2-1 on which the IC chip is placed via the ACF is positioned at the substrate feeding/taking-out position I, the film substrate 2-1 is taken out from the substrate holding device 42a and carried to a next step. Meanwhile, a film substrate 2 to which an IC chip is to be placed next is carried in to the substrate feeding/taking-out position I.

Thereafter, the operations described above are repeated so that plasma processing of film substrates 2, . . . , 2 and IC chip mounting processing via an ACF after the plasma processing are automatically performed in succession.

As one example, plasma processing conditions are described below.

As plasma processing change conditions, a flow rate of the oxygen gas is 0 to 20 sccm, a flow rate of the Ar gas is 0 to 20 sccm, high frequency power is 0 to 300 W, and a degree of vacuum is 10 to 100 Pa. A gas introduction system has three systems (as one example, the Ar gas flows at 50 sccm, the oxygen gas flows at 50 sccm, and a spare gas flows at 50 sccm) as shown. A communicating tube 60 for direct connection has one system.

A vacuum pumping system uses a rotary pump as one example of an evacuation pump Rp, and a manual conductance valve (automatic evacuation control valve APC may be used), which is Cv in FIG. 8.

One example of ultimate vacuum degree is 9 Pa or lower.

A flow rate of cooling water for the substrate electrode is 15 l/min, pressure is 1127.8 to 294.2 kPa (11.5 to 3 kgf/cm$^2$) (no backing pressure), and water temperature is 15 to 30° C. (room temperature or higher is preferable to prevent dropwise condensation).

Conditions of a supply piping system are as follows. A flow rate of compressed air is 10 l/min, and pressure is 490.3 kPa (5 kgf/cm$^2$) or higher. A flow rate of the nitrogen gas for purge is 10 l/min, and pressure is 19.6 kPa (2 kgf/cm$^2$) or higher. A flow rate of the Ar gas is 50 cc/min, and pressure is 147.1 kPa (1.5 kgf/cm$^2$) or higher. A flow rate of the oxygen gas is 50 cc/min, and pressure is 147.1 kPa (1.5 kgf/cm$^2$) or higher. A flow rate of a spare gas is 50 cc/min, and pressure is 147.1 kPa (1.5 kgf/cm$^2$) or higher. Only one kind of a nitrogen gas is used for purge. The compressed air is used for a cylinder used to vertically move the transfer arm, chamber lid or the like. Only a nitrogen gas is used for purge, and three process gases, that is Ar, O$_2$, and a spare gas are used.

According to the above embodiment, two pairs of film substrates 2, . . . , 2 are carried in from the outside of the plasma processing apparatus main body 10 to the substrate carrying position B in the plasma processing apparatus main body, and each pair of the film substrates 2, 2 positioned at the substrate carrying position are independently carried into the chambers 8A, 8B. While the chambers 8A, 8B are being evacuated, a reaction gas is introduced, and high frequency power is applied under low pressure to generate plasma so that plasma processing for removing organic matter from the pair of film substrates 2, 2 is performed. The pair of film substrates 2, 2 subjected to the plasma processing are independently taken out from the chambers BA, 813 and positioned at the substrate carrying-out position C in the plasma processing apparatus main body. Then, the pair of film substrates 2, 2 positioned at the substrate carrying-out position C are carried out of the plasma processing apparatus main body. Accordingly, each pair of film substrates 2, 2 can be automatically carried in, subjected to plasma processing, and carried out independently. Low pressure plasma washing of the film substrates 2, . . . , 2 are fully automated by the controller 20 to eliminate human involvement and can be placed in an inline of film substrates 2, . . . , 2 mounting steps.

Furthermore, since the low pressure plasma washing can be fully automated, a throughput can be improved, contamination of film substrates 2, . . . , 2 can be effectively prevented, and the film substrates 2, . . . , 2 can be readily managed.

Furthermore, a pair of film substrates 2, 2 can be simultaneously carried, and the two substrates can be simultaneously subjected to plasma processing. That is, since plasma processing can be independently and simultaneously performed in double chambers, that is, two chambers 8 of the first chamber 8A and the second chamber 8B, a high throughput can be achieved.

Furthermore, when nitrogen purge is started, the direct connection valve SHv of the communicating tube 60 for communicating the first chamber 8A and the second chamber 8B is opened to communicate the chamber 8A or 8B in which plasma processing has been performed and the chamber 8B or 8A immediately after an evacuation operation for plasma processing is started by closing the lid 8a. Consequently, the chamber 8A or 8B in which plasma processing has been performed can be rapidly and efficiently recovered from a low pressure state to a same pressure state.

Furthermore, by designing a volume of each chamber 8 based on a maximum dimension of a film substrate 2 to be subjected to plasma processing so as to be optimized, a volume of each chamber 8 can be minimized, and evacuation time can be minimized.

Furthermore, since a film substrate 2 is held on a substrate electrode 8b in each chamber 8 by electrostatic chuck, the substrate electrode 8b does not need to be replaced even when a shape of the film substrate 2 differs, and hence a loss due to replacement of the substrate electrode 8b when a type of the film substrate 2 is changed can be reduced. Furthermore, a film substrate holding jig can also be made unnecessary in the chamber. Furthermore, since a drive unit is disposed lower than a work surface, and no sliding portion exists on an upper surface of a work or in a chamber, dust can be prevented. Furthermore, by generating plasma for each set number of film substrates without inserting the film substrates in the chamber to scatter contaminants attached to the inside of the chamber or the electrode, the inside of the chamber can be automatically cleaned.

It is noted that the present invention is not limited to the above embodiment, but can be applied in other various aspects.

Figure 24:
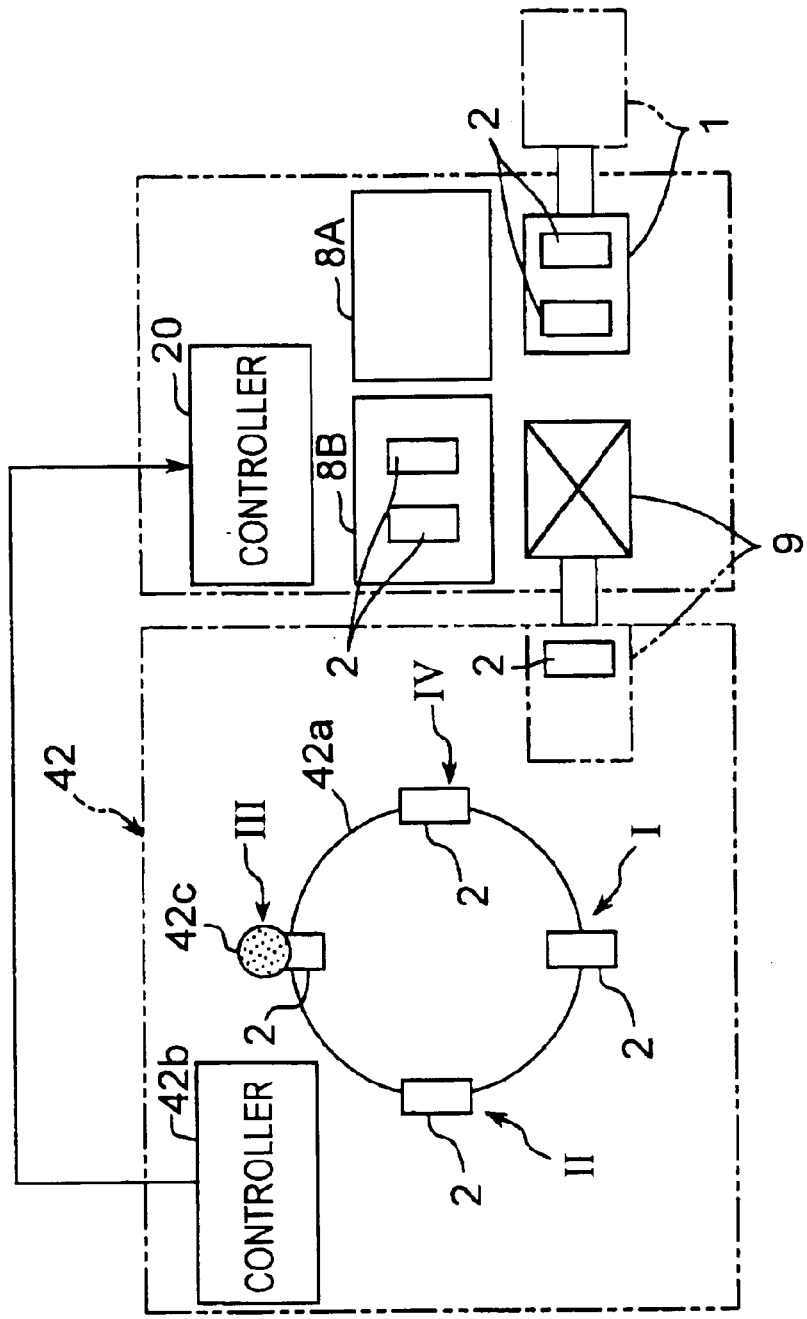
FIG. 24 is an explanatory view for explaining an operation of a controller of the plasma processing apparatus in a modification of the above embodiment of the present invention when an abnormally stuck ACF is detected in an inspection of an IC bonder.

For example, as shown in FIG. 24, after an ACF is stuck to a film substrate 2 held by the substrate holding device 42a of the IC bonder 42 and positioned at the ACF sticking position II, the film substrate is inspected by an inspection device 42c at the inspection position III. When abnormal sticking of the ACF is detected by a controller 42b, a signal to this effect is inputted from the controller 42b to the controller 20 of the plasma processing apparatus, and, assuming that the plasma processing for the film substrate 2 is insufficient, high frequency power for plasma processing can be increased or plasma processing time can be made longer. Furthermore, when inspection is performed by the inspection device 42c at the inspection position III, and abnormality such as a disconnection of a film bonding portion is recognized by the controller 42b, a signal to the effect is inputted from the controller 42b to the controller 20 of the plasma processing apparatus, and, assuming that the plasma processing for the film substrate 2 is excessive, high frequency power for plasma processing can be reduced, or plasma processing time can be made shorter.

Figure 25:
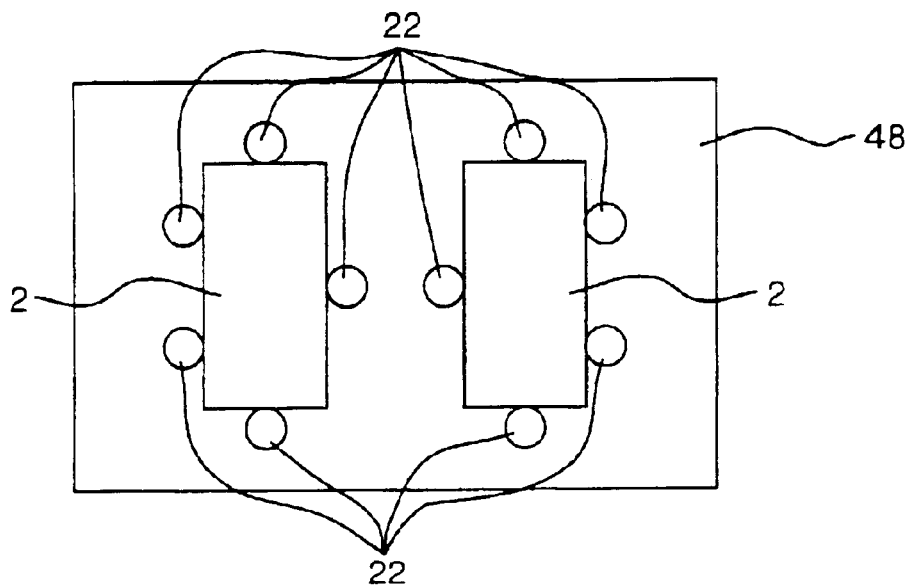
FIG. 25 is a plan view showing a mechanism of holding a film substrate on a substrate electrode in each chamber which is one modification of the above embodiment of the present invention.
Figure 26:
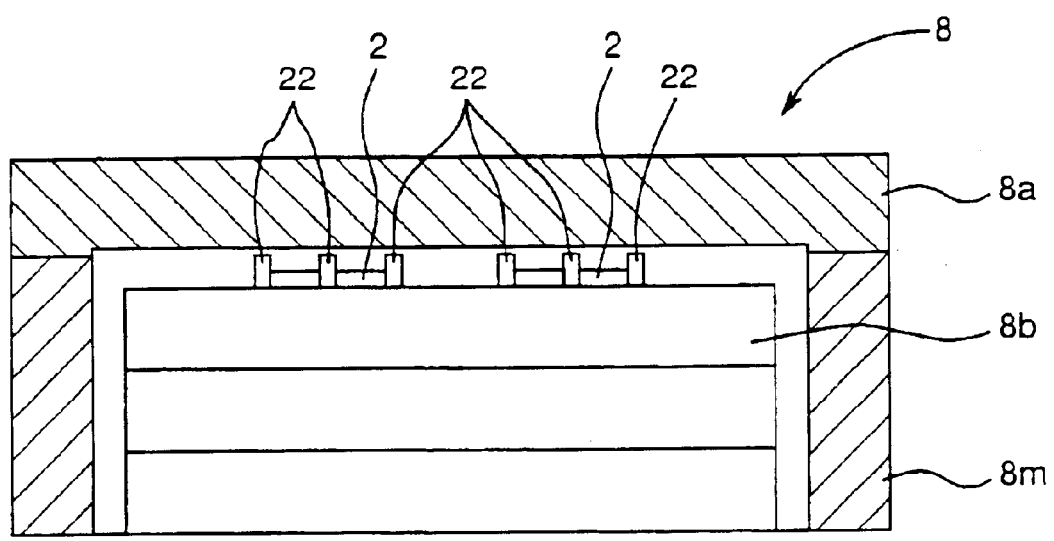
FIG. 26 is a partial cross-sectional side view showing a state that a film substrate is held by the holding mechanism of the modification in FIG. 25.

Furthermore, when a film substrate 2 is held on the substrate electrode 8b in each chamber 8, holding means is not limited to electrostatic chuck, but the substrate may be held by other means, for example, an engaging member or the like. Specifically, as shown in FIGS. 25 and 26, insulating adjusting pins 22, . . . , 22 that adjust movement of the film substrate 2 surrounding the film substrate 2 to adjust the movement of the film substrate 2 may be provided to hold the film substrate 2 on the substrate electrode 8b. In this case, when a shape of the film substrate 2 differs, the electrode may be replaced with one with insulating adjusting pins 22, . . . , 22 corresponding to the shape of the film substrate 2.

Figure 27:
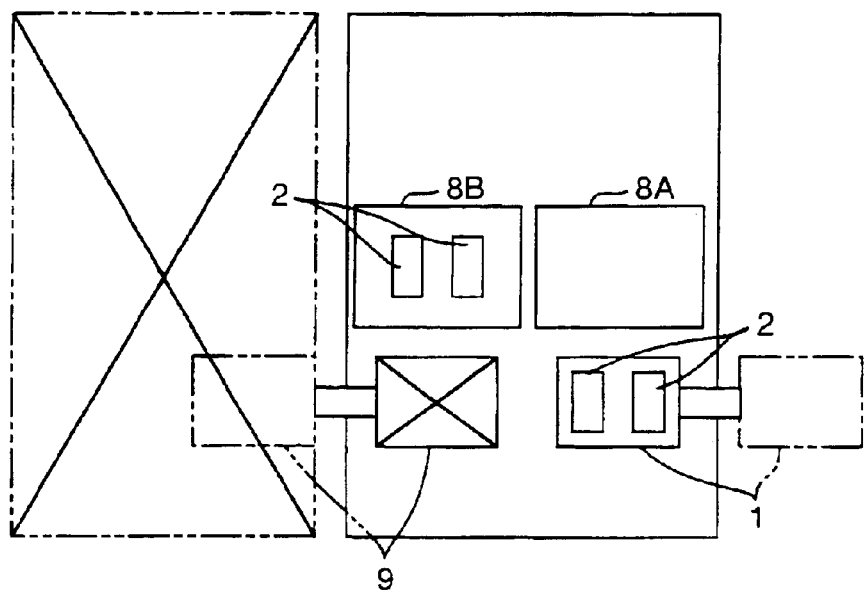
FIG. 27 is an explanatory view for explaining handling of a film substrate in a chamber in the case where the film substrate is positioned in the chamber and an apparatus for a subsequent step adjacent to the plasma processing apparatus is stopped due to a trouble or the like which is another modification of the above embodiment of the present invention.

Furthermore, as shown in FIG. 27, when a film substrate 2 is positioned in the chamber 8, and a device for a next step adjacent to the plasma processing apparatus is stopped due to a trouble or the like, the film substrate 2 is vacuum-stored while low pressure is maintained in the chamber 8. After the trouble or the like of the device for the next step is eliminated, the chamber is recovered from the low pressure state to an atmospheric pressure state, and then the film substrate 2 may be taken out from the inside of the chamber 8.

Furthermore, as shown in FIG. 28, when a film substrate 2 is positioned on the substrate carrying-out slider 9 or the substrate carrying-in slider 1, and a device for a next step adjacent to the plasma processing apparatus is stopped due to a trouble or the like, the film substrate 2 positioned on the substrate carrying-out slider 9 or the substrate carrying-in slider 1 is inserted into the chamber 8, and pressure is reduced so that the film substrate can be vacuum-stored. As required, plasma processing may be performed for a short time. After the trouble or the like of the device for the next step is eliminated, the chamber is recovered from the low pressure state to an atmospheric pressure state, and then the film substrate 2 may be taken out from the inside of the chamber 8.

Furthermore, the suction units 7, 7 of the carrying arm devices 3A, 3B may be replaced depending on the shape of a film substrate 2, or their positions may be changed, as required.

Furthermore, when, among the plasma processing conditions, parameters (for example, a high frequency power value, plasma processing time T1, gas evacuation time T2, carrying parameter, gas flow rate, gas type, and so forth) that change for each different type of a film substrate 2 are stored in a memory 800 connected to the controller 20, for example, in relation to type information of the film substrate 2 for batch management, the aforementioned parameters in the plasma processing conditions can be automatically set and controlled by the controller 20 once the type of the film substrate 2 is determined. Therefore, changes of the parameters do not need to be manually inputted by operators for each different type of a film substrate 2. The ON pressure P1 of the main valve, backing ground pressure P2, and purge stabilization time T3 are stored in the aforementioned memory 800 as machine data unique to the plasma processing apparatus beforehand.

Figure 30C:
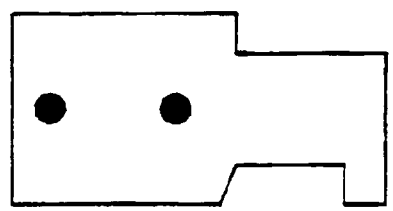
FIGS. 30A, 30B, and 30C are schematic views showing an L-shaped film substrate, C-shaped film substrate, and I-shaped film substrate, respectively, that can be processed in plasma processing of the above embodiment of the present invention.
Figure 30B:
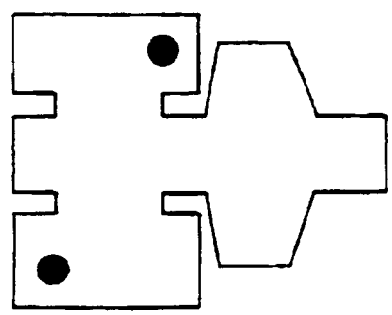
Figure 30A:
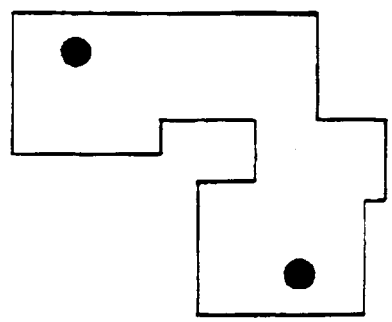
Figure 31:
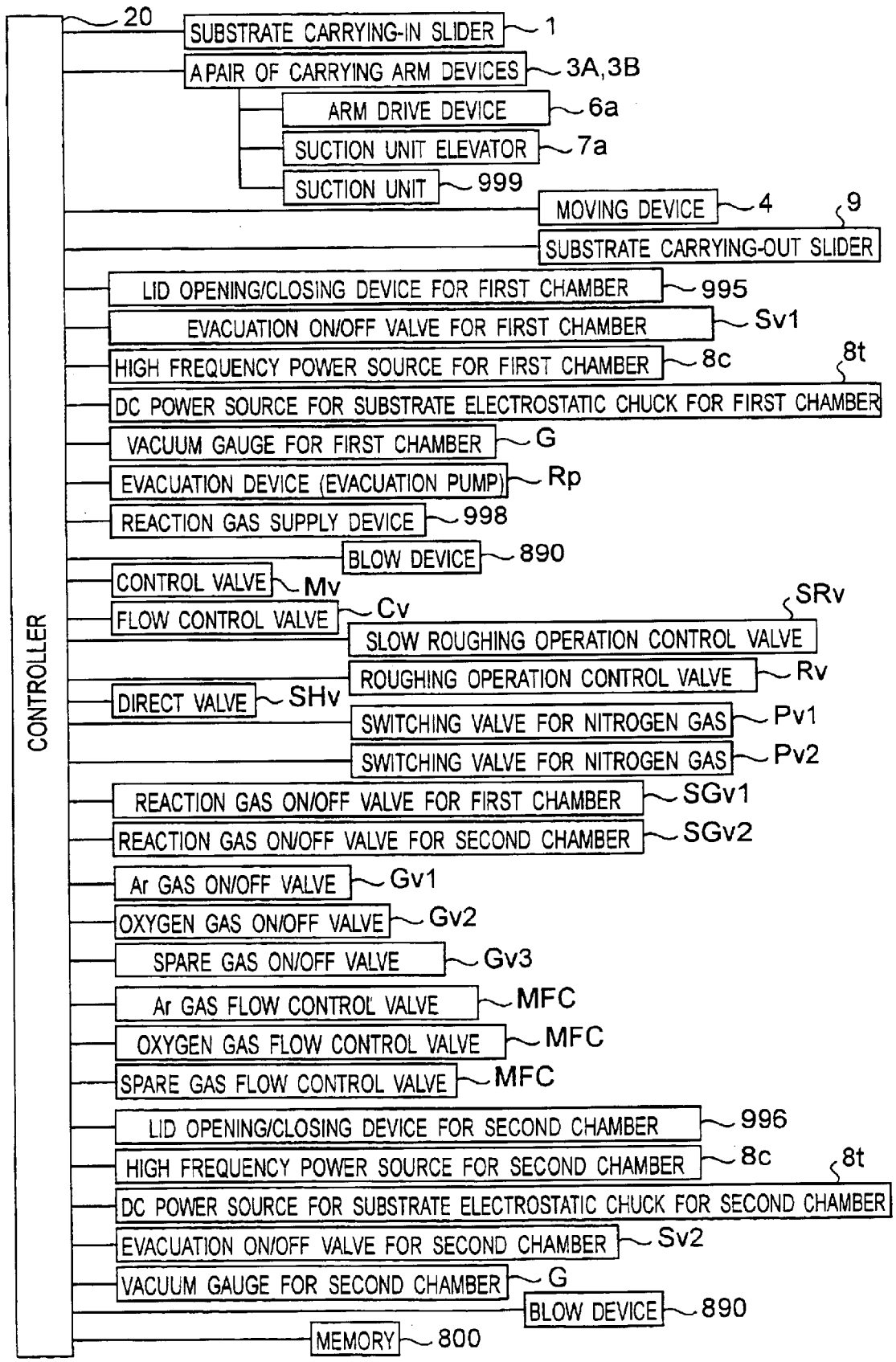
FIG. 31 is a block diagram showing the plasma processing apparatus.

Furthermore, examples of the film substrate include those in various shapes such as a quadrangle, L-shape, C-shape, and I-shape. It is preferable to suck a film substrate in any shape at sites that are not through holes and bonding surfaces. For example, as shown in FIGS. 30A, 30B, and 30C, it is preferable to suck an L-shaped film substrate, C-shaped film substrate, or I-shaped film substrate at two sites shown with black dots distant from each other with a certain distance to avoid the through holes and the bonding surfaces.

It is noted that, by appropriately combining arbitrary embodiments of the above various embodiments, effects of each embodiment can be exhibited.

According to the present invention, a film substrate is carried in from the outside of a plasma processing apparatus main body to a substrate carrying position in the plasma processing apparatus main body, the film substrate positioned at the substrate carrying position is carried into a chamber, and a reaction gas is introduced while the chamber is being evacuated. Under low pressure, high frequency power is applied to generate plasma so that plasma processing is performed to remove organic matter from the film substrate. The film substrate subjected to the plasma processing is taken out from the chamber and positioned at a substrate carrying-out position in the plasma processing apparatus main body, and the film substrate positioned at the substrate carrying-out position is carried out of the plasma processing apparatus main body. Therefore, each film substrate can be independently and automatically carried in, subjected to plasma processing, and carried out, and low pressure plasma washing of the film substrate is fully automated to eliminate human involvement and can be placed in an inline of film substrate mounting steps.

Furthermore, since the low pressure plasma washing can be fully automated, a throughput can be improved, contamination of the film substrate can be effectively prevented, and the film substrate can be readily managed.

Furthermore, when a pair of film substrates are simultaneously carried, and the two substrates are simultaneously subjected to plasma processing, simultaneous and independent plasma processing can be performed in double chambers, that is, two chambers of the first chamber and the second chamber, resulting in a high throughput.

Furthermore, when nitrogen purge is started, a connection valve of a communicating tube for communicating the first chamber and the second chamber is opened so that a chamber in which plasma processing has been performed and a chamber immediately after an evacuation operation for plasma processing is started are communicated. Consequently, the chamber in which plasma processing has been performed can be rapidly and efficiently recovered from a low pressure state to an atmospheric pressure state.

Furthermore, when a film substrate is held on a substrate electrode by electrostatic chuck in the chamber, the substrate electrode does not need to be replaced even when the shape of the film substrate differs, and a loss due to replacement of the substrate electrode when the type of the film substrate is changed can be reduced. Furthermore, a film substrate holding jig can be made unnecessary in the chamber.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A low pressure plasma processing apparatus comprising:

a carrying arm device operable to hold a film substrate, wherein the carrying arm device is arranged in a plasma processing apparatus main body;

a chamber arranged in the plasma processing apparatus main body, to which the film substrate held by the carrying arm device is carried, to which a reaction gas is introduced while the chamber is being evacuated, to which high frequency power is applied under low pressure to generate plasma so that plasma processing is performed to remove organic matter from the film substrate, and from which the film substrate subjected to the plasma processing and held by the carrying arm device is carried out;

a moving device arranged in the plasma processing apparatus main body, wherein the moving device is operable to, by drive of the carrying arm device, move the film substrate held by the carrying arm device from a substrate carrying-in position in the plasma processing apparatus main body into the chamber, and move the film substrate from an inside of the chamber to a substrate carrying-out preparation position in the plasma processing apparatus main body;

a substrate carrying-in slider operable to hold and carry in the film substrate from a substrate carrying-in preparation position at an outside of the plasma processing apparatus main body into the substrate carrying-in position in the plasma processing apparatus main body; and a substrate carrying-out slider operable to hold and carry out the film substrate subjected to the plasma processing from the substrate carrying-out preparation position at an inside of the plasma processing apparatus main body to a substrate carrying-out position at an outside of the plasma processing apparatus main body.

2. The low pressure plasma processing apparatus according to claim 1, wherein the chamber comprises a first chamber and a second chamber, each for subjecting a plurality of the film substrates to plasma processing, and, independently performing plasma processing including, after the film substrates are carried into the first chamber and the second chamber, introducing a reaction gas while the chambers are being evacuated, and applying high frequency power under low pressure to generate plasma so that organic matter is removed from the film substrate.

3. The low pressure plasma processing apparatus according to claim 2, further comprising a communicating tube for communicating the first chamber and the second chamber and an opening/closing valve for opening/closing the communicating tube, wherein, after the film substrate is carried in and taken out from one chamber of the first chamber and the second chamber, pressure is decreased from an atmospheric pressure state to a low pressure state and at the same time, taking-out of the film substrate is prepared by recovering the other chamber from a low pressure state to an atmospheric pressure state, and at the preparing time, the opening/closing valve is opened to communicate the first chamber and the second chamber by the communicating tube so that both the first chamber and the second chamber have a same pressure.

4. The low pressure plasma processing apparatus according to claim 2, further comprising a communicating tube for communicating the first chamber and the second chamber and an opening/closing valve for opening/closing the communicating tube, wherein, after the film substrate is carried in and taken out from one chamber of the first chamber and the second chamber, pressure is decreased from an atmospheric pressure state to a low pressure state and, at the same time taking-out of the film substrate is prepared by recovering the other chamber from a low pressure state to an atmospheric pressure state, and at the preparing time the opening/closing valve is opened to communicate the first chamber and the second chamber by the communicating tube so that both the first chamber and the second chamber have a same pressure.

5. The low pressure plasma processing apparatus according to claim 1, wherein the film substrate is sucked and held to a substrate electrode on which high frequency power is applied by electrostatic chuck in the chamber.

6. The low pressure plasma processing apparatus according to claim 1, wherein the film substrate is electrostatically chucked and held to an electrode on which high frequency power is applied by electrostatic chuck in the chamber.

* * * * *